(12) United States Patent
Kimura et al.

(10) Patent No.: US 9,667,148 B2
(45) Date of Patent: May 30, 2017

(54) PHOTOELECTRIC TRANSDUCER DEVICE INCLUDING A TRANSISTOR INCLUDING AN OXIDE SEMICONDUCTOR LAYER

(75) Inventors: Hajime Kimura, Kanagawa (JP); Yoshiaki Ito, Tokyo-to (JP); Takuro Ohmaru, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 979 days.

(21) Appl. No.: 13/150,652

(22) Filed: Jun. 1, 2011

(65) Prior Publication Data

US 2012/0019222 A1    Jan. 26, 2012

(30) Foreign Application Priority Data

Jun. 4, 2010  (JP) .................................. 2010-129033

(51) Int. Cl.
G05F 1/10        (2006.01)
H02M 3/158    (2006.01)
H01L 27/12     (2006.01)
H01L 31/048   (2014.01)
H02S 40/32     (2014.01)

(52) U.S. Cl.
CPC ...... H02M 3/1588 (2013.01); H01L 27/1225 (2013.01); H01L 27/1233 (2013.01); H01L 31/048 (2013.01); H02S 40/32 (2014.12); *Y02B 70/1466* (2013.01); *Y02E 10/50* (2013.01)

(58) Field of Classification Search
CPC ............ H01L 27/1225; H01L 27/1233; H01L 31/0428; H01L 31/048; H02M 3/1588; H02M 3/156; H02M 3/158; Y02B 70/126; H02S 40/32

USPC .......... 323/221–224, 271, 282, 906; 307/116, 307/117

See application file for complete search history.

(56) References Cited

U.S. PATENT DOCUMENTS 3,731,161 A * 5/1973 Yamamoto ............ H01L 27/088
                                                                    148/DIG. 122
4,472,641 A     9/1984 Dickey et al.
(Continued)

FOREIGN PATENT DOCUMENTS

JP         8-279518       10/1996
JP         9-69647         3/1997
(Continued)

OTHER PUBLICATIONS

Nuzillat, G. et al., "A Subnanosecond Integrated Switching Circuit with MESFET's for LSI," IEEE Journal of Solid-State Circuits, vol. SC-11, No. 3, Jun. 1, 1976, pp. 385-394.
(Continued)

*Primary Examiner* — Gustavo Rosario Benitez
(74) *Attorney, Agent, or Firm* — Husch Blackwell LLP

(57) ABSTRACT

An object is to obtain a rectifier having a small voltage drop and to reduce the fabrication cost of a converter circuit. A photoelectric transducer device including: a photoelectric transducer element; and a converter circuit stepping up or stepping down an output of the photoelectric transducer element and including a switching element and a rectifier, in which the switching element is a first oxide semiconductor transistor that is normally off and in which the rectifier is a second oxide semiconductor transistor that is diode-connected and normally on.

30 Claims, 15 Drawing Sheets

(56) References Cited

U.S. PATENT DOCUMENTS

| | | | |
|---|---|---|---|
| 5,161,097 A | 11/1992 | Ikeda | |
| 5,661,644 A | 8/1997 | Bergman et al. | |
| 5,909,108 A | 6/1999 | He et al. | |
| 6,021,499 A | 2/2000 | Aleshi | |
| 6,038,147 A | 3/2000 | Jacobs et al. | |
| 6,362,798 B1* | 3/2002 | Kimura et al. | 345/55 |
| 6,449,136 B2 | 9/2002 | Galecki et al. | |
| 6,580,251 B2 | 6/2003 | Takeuchi | |
| 6,734,655 B1* | 5/2004 | Javanifard | G11C 5/145 323/222 |
| 6,757,590 B2 | 6/2004 | Ross et al. | |
| 7,118,970 B2 | 10/2006 | Das et al. | |
| 7,443,052 B2 | 10/2008 | Wendt et al. | |
| 7,667,448 B2 | 2/2010 | Matsumoto et al. | |
| 7,671,487 B2 | 3/2010 | Wang et al. | |
| 7,705,362 B2 | 4/2010 | Das et al. | |
| 7,943,439 B2 | 5/2011 | Yoshikawa | |
| 8,304,298 B2 | 11/2012 | Ofuji et al. | |
| 8,319,215 B2 | 11/2012 | Yamazaki et al. | |
| 8,563,977 B2 | 10/2013 | Shimada et al. | |
| 2004/0257155 A1* | 12/2004 | McEwen | 330/59 |
| 2005/0041437 A1* | 2/2005 | Chian | H02M 3/3381 363/16 |
| 2005/0068002 A1 | 3/2005 | Ozeki | |
| 2005/0265057 A1* | 12/2005 | Zhang | H02M 3/1588 363/127 |
| 2006/0033480 A1* | 2/2006 | Soldano | 323/225 |
| 2006/0092588 A1 | 5/2006 | Realmuto et al. | |
| 2007/0052025 A1* | 3/2007 | Yabuta | H01L 29/7869 257/347 |
| 2007/0085514 A1* | 4/2007 | Utsunomiya | 323/222 |
| 2007/0139976 A1* | 6/2007 | deRochemont | B82Y 30/00 363/17 |
| 2007/0164612 A1 | 7/2007 | Wendt et al. | |
| 2008/0007243 A1 | 1/2008 | Matsumoto et al. | |
| 2009/0009104 A1* | 1/2009 | Doi et al. | 315/291 |
| 2009/0061721 A1* | 3/2009 | Isa | H01L 27/1266 445/24 |
| 2009/0291520 A1 | 11/2009 | Yoshikawa | |
| 2009/0293954 A1 | 12/2009 | Yamazaki | |
| 2010/0135053 A1* | 6/2010 | Morimoto | H02M 7/219 363/127 |
| 2011/0133706 A1* | 6/2011 | Takahashi | H01L 27/12 323/265 |
| 2011/0273021 A1 | 11/2011 | Kimura et al. | |
| 2011/0309239 A1 | 12/2011 | Kimura et al. | |
| 2012/0132911 A1 | 5/2012 | Shimada et al. | |
| 2013/0069058 A1 | 3/2013 | Yamazaki et al. | |

FOREIGN PATENT DOCUMENTS

| | | |
|---|---|---|
| JP | 2002-108466 | 4/2002 |
| JP | 2002-141539 | 5/2002 |
| JP | 2004-22639 | 1/2004 |
| JP | 2005-312158 | 11/2005 |
| JP | 2006-108169 A | 4/2006 |
| JP | 2008-11584 | 1/2008 |
| JP | 2008-300572 | 12/2008 |
| JP | 2009-004733 A | 1/2009 |
| JP | 2009-10414 | 1/2009 |
| JP | 2009-099944 A | 5/2009 |
| JP | 2009-200372 | 9/2009 |
| JP | 2009-266938 A | 11/2009 |
| JP | 2010-10667 | 1/2010 |
| JP | 2010-109359 A | 5/2010 |
| WO | WO 2008/143304 A1 | 11/2008 |
| WO | WO 2009/034953 A1 | 3/2009 |
| WO | WO 2009/041544 A1 | 4/2009 |
| WO | WO 2010/038820 A1 | 4/2010 |

OTHER PUBLICATIONS

Schneider, C.R. et al., "Analog CMOS Deterministic Boltzmann Circuits," IEEE Journal of Solid-State Circuits, vol. 28, No. 8, Aug. 1, 1993, pp. 907-914.

Cheng, W. et al., "Impact of Improved High-Performance Si(110)-Oriented Metal-Oxide-Semiconductor Field-Effect Transistors Using Accumulation-Mode Fully Depleted Silicon-on-Insulator Devices," Japanese Journal of Applied Physics, vol. 45, No. 4B, Apr. 25, 2006, pp. 3110-3116.

* cited by examiner

PHOTOELECTRIC TRANSDUCER DEVICE INCLUDING A TRANSISTOR INCLUDING AN OXIDE SEMICONDUCTOR LAYER

BACKGROUND OF THE INVENTION

1. Field of the Invention

One embodiment of the disclosed invention relates to a photoelectric transducer device and a method of fabricating the photoelectric transducer device.

2. Description of the Related Art

An example of a photoelectric transducer element which directly converts received light into power by a photovoltaic effect and outputs the power is a solar cell (see Patent Document 1). Unlike with a conventional power generation method, it is not necessary to convert light into thermal energy or kinetic energy in generating power with a solar cell.

Further, a photoelectric transducer device having a solar cell and a converter circuit, which converts direct-current (DC) power generated by the solar cell, formed on a surface of the solar cell where light is not received has attracted attention as a small or middle-sized photo voltaic system or an emergency power source (see Patent Document 2 or Patent Document 3).

Examples of such a converter circuit include a DC-DC converter (direct current-direct current converter) and a DC-AC converter (direct current-alternating current converter) (see Patent Document 4 or Patent Document 5).

The converter circuit shown in Patent Document 4 or Patent Document 5 includes a switching element and a rectifier. A transistor is used as the switching element, and a diode is used as the rectifier. A PN diode, for example, is used as such a diode (see Patent Document 6).

REFERENCE

[Patent Document 1] Japanese Published Patent Application No. 2010-10667
[Patent Document 2] Japanese Published Patent Application No. H9-69647
[Patent Document 3] Japanese Published Patent Application No. 2002-141539
[Patent Document 4] Japanese Published Patent Application No. 2005-312158
[Patent Document 5] Japanese Published Patent Application No. 2009-200372
[Patent Document 6] Japanese Published Patent Application No. 2004-22639

SUMMARY OF THE INVENTION

As shown in Patent Document 6, a PN diode has a large voltage drop.

In view of the above problem, an object of one embodiment of the disclosed invention is to provide a rectifier having a small voltage drop.

The converter circuit shown in Patent Document 4 or Patent Document 5 includes, for example, a diode and a transistor. Such a diode and a transistor are fabricated in different processes, making the fabrication cost of the converter circuit high.

In view of the above problem, an object of one embodiment of the disclosed invention is to reduce the fabrication cost of the converter circuit.

In one embodiment of the disclosed invention, a diode-connected normally-on transistor is used as a rectifier included in a converter circuit.

A normally-on transistor can be obtained by controlling the film thickness of a channel formation region.

A rectifier that is a diode-connected normally-on transistor has a smaller voltage drop than a PN diode.

A diode-connected normally-on transistor has a smaller voltage drop than a PN diode, and thus needs a low voltage to compensate a voltage drop. A diode-connected normally-on transistor needs a low voltage to compensate a voltage drop, and thus achieves low power consumption of a converter circuit. A reduction in the power consumption of a converter circuit leads to a reduction in the power consumption of a photoelectric transducer device.

Thus, the use of a diode-connected normally-on transistor as a diode is preferable in that it reduces a voltage drop, needs a low voltage to compensate a voltage drop, reduces the power consumption of a converter circuit, and reduces the power consumption of a photoelectric transducer device.

Further, in one embodiment of the disclosed invention, a transistor is used as a switching element included in a converter circuit and a transistor that is similar to the above transistor and diode-connected is used as a rectifier. In other words, a rectifier and a switching element included in a converter circuit can be fabricated using the same materials and in the same process.

Since a rectifier and a switching element can be fabricated using the same materials and in the same process, fabrication cost can be reduced.

One embodiment of the disclosed invention relates to a photoelectric transducer device comprising: a photoelectric transducer element; and a converter circuit stepping up or stepping down an output of the photoelectric transducer element and including a switching element and a rectifier. In the photoelectric transducer device, the switching element is a first oxide semiconductor transistor that is normally off, and the rectifier is a second oxide semiconductor transistor that is diode-connected and normally on.

One embodiment of the disclosed invention relates to a photoelectric transducer device comprising: a photoelectric transducer element; and a converter circuit stepping up or stepping down an output of the photoelectric transducer element and including a switching element and a rectifier. In the photoelectric transducer device, the switching element is a first oxide semiconductor transistor that is normally off, and the rectifier is a second oxide semiconductor transistor that is diode-connected and normally on. In the photoelectric transducer device, a film thickness of a channel formation region of the first oxide semiconductor transistor is different from a film thickness of a channel formation region of the second oxide semiconductor transistor.

One embodiment of the disclosed invention relates to a photoelectric transducer device comprising: a photoelectric transducer element; and a converter circuit stepping up or stepping down an output of the photoelectric transducer element and including a switching element and a rectifier. In the photoelectric transducer device, the switching element is a first oxide semiconductor transistor that is normally off, and the rectifier is a second oxide semiconductor transistor that is diode-connected and normally on. In the photoelectric transducer device, a film thickness of a channel formation region of the first oxide semiconductor transistor is smaller than a film thickness of a channel formation region of the second oxide semiconductor transistor.

One embodiment of the disclosed invention relates to a photoelectric transducer device comprising: a solar cell; and a converter circuit stepping up or stepping down an output of the solar cell and including a switching element and a rectifier. In the photoelectric transducer device, the switching element is a first oxide semiconductor transistor that is normally off, and the rectifier is a second oxide semiconductor transistor that is diode-connected and normally on.

One embodiment of the disclosed invention relates to a photoelectric transducer device comprising: a solar cell; and a converter circuit stepping up or stepping down an output of the solar cell and including a switching element and a rectifier. In the photoelectric transducer device, the switching element is a first oxide semiconductor transistor that is normally off, and the rectifier is a second oxide semiconductor transistor that is diode-connected and normally on. In the photoelectric transducer device, a film thickness of a channel formation region of the first oxide semiconductor transistor is different from a film thickness of a channel formation region of the second oxide semiconductor transistor.

One embodiment of the disclosed invention relates to a photoelectric transducer device comprising: a solar cell; and a converter circuit stepping up or stepping down an output of the solar cell and including a switching element and a rectifier. In the photoelectric transducer device, the switching element is a first oxide semiconductor transistor that is normally off, and the rectifier is a second oxide semiconductor transistor that is diode-connected and normally on. In the photoelectric transducer device, a film thickness of a channel formation region of the first oxide semiconductor transistor is smaller than a film thickness of a channel formation region of the second oxide semiconductor transistor.

In one embodiment of the disclosed invention, the first oxide semiconductor transistor and the second oxide semiconductor transistor each comprise: an island-shaped oxide semiconductor layer including a channel formation region; a source electrode in contact with the island-shaped oxide semiconductor layer; and a drain electrode in contact with the island-shaped oxide semiconductor layer. A region of the island-shaped oxide semiconductor layer having no overlap with the source electrode and the drain electrode is thinner than a region of the island-shaped oxide semiconductor layer overlapping with the source electrode and the drain electrode.

In one embodiment of the disclosed invention, the first oxide semiconductor transistor and the second oxide semiconductor transistor each comprise: an island-shaped oxide semiconductor layer including a channel formation region; a source electrode over the island-shaped oxide semiconductor layer; and a drain electrode over the island-shaped oxide semiconductor layer. Oxide semiconductor layer having higher conductivity than the island-shaped oxide semiconductor layer are formed between the island-shaped oxide semiconductor layer and the source electrode and between the island-shaped oxide semiconductor layer and the drain electrode.

In one embodiment of the disclosed invention, the converter circuit is a DC-DC converter.

In one embodiment of the disclosed invention, the converter circuit is a DC-DC converter including a coil and a capacitor.

Note that, in this specification, a normally-off transistor refers to a transistor in which a drain current flow does not occur when the gate voltage applied to a gate electrode is 0 V and the voltage applied between a source and a drain is at least 1 V. In contrast, a normally-on transistor refers to a transistor in which a drain current flow occurs when the gate voltage applied to a gate electrode is 0 V and the voltage applied between a source and a drain is at least 1 V.

Alternatively, in this specification, a normally-off transistor refers to an n-channel transistor whose threshold voltage is positive or a p-channel transistor whose threshold voltage is negative. In contrast, a normally-on transistor refers to an n-channel transistor whose threshold voltage is negative or a p-channel transistor whose threshold voltage is positive.

Specifically, in this specification, a normally-off transistor refers to an n-channel transistor whose gate voltage is positive when the drain current is $1\times10^{-12}$ A according to the measurement of drain current-gate voltage characteristics. In contrast, a normally-on transistor refers to an n-channel transistor whose gate voltage is negative when the drain current is $1\times10^{-12}$ A according to the measurement of drain current-gate voltage characteristics.

A rectifier that is one embodiment of the disclosed invention has a smaller voltage drop than a PN diode. Since the rectifier that is one embodiment of the disclosed invention has a smaller voltage drop than a PN diode, a voltage applied to the rectifier to compensate a voltage drop is low, which reduces the power consumption of a converter circuit. A reduction in the power consumption of a converter circuit leads to a reduction in the power consumption of a photoelectric transducer device.

Thus, the use of a diode-connected normally-on transistor as a rectifier is preferable in that it reduces a voltage drop, needs a low voltage to compensate a voltage drop, reduces the power consumption of a converter circuit, and reduces the power consumption of a photoelectric transducer device.

Further, a rectifier and a switching element included in a converter circuit can be fabricated using the same materials and in the same process.

Since a rectifier and a switching element which are included in a converter circuit can be fabricated using the same materials and in the same process, the fabrication cost of the converter circuit can be reduced. Since the fabrication cost of a converter circuit can be reduced, the fabrication cost of a photoelectric transducer device can be reduced.

DETAILED DESCRIPTION OF THE INVENTION

Figure 1A:
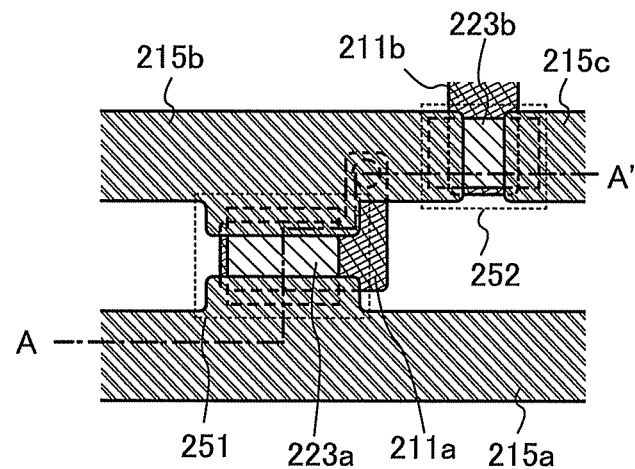
FIGS. 1A and 1B are a top view and a cross-sectional view of oxide semiconductor transistors.

Embodiments of the disclosed invention will be described below in detail with reference to the drawings. Note that the disclosed invention can be implemented with various modes. It will be readily appreciated by those skilled in the art that modes and details of the disclosed invention can be modified in various ways without departing from the spirit and scope of the present invention. Note that in the drawings, the same portions or portions having a similar function are denoted by the same reference numeral, and repetitive description will be omitted.

Embodiment 1

Photoelectric transducer devices of Embodiment 1 will be described with reference to FIGS. 1A and 1B, FIGS. 2A to 2C, FIGS. 3A and 3B, FIG. 4, FIGS. 5A and 5B, FIGS. 6A to 6F, FIGS. 7A to 7D, FIGS. 8A to 8C, FIGS. 9A to 9F, FIGS. 10A to 10F, and FIG. 11.

Examples of the converter circuit of this embodiment will be described with reference to FIGS. 3A and 3B. Each of the converter circuit of this embodiment is a DC-DC converter that converts DC voltage into DC voltage.

Figure 3A:
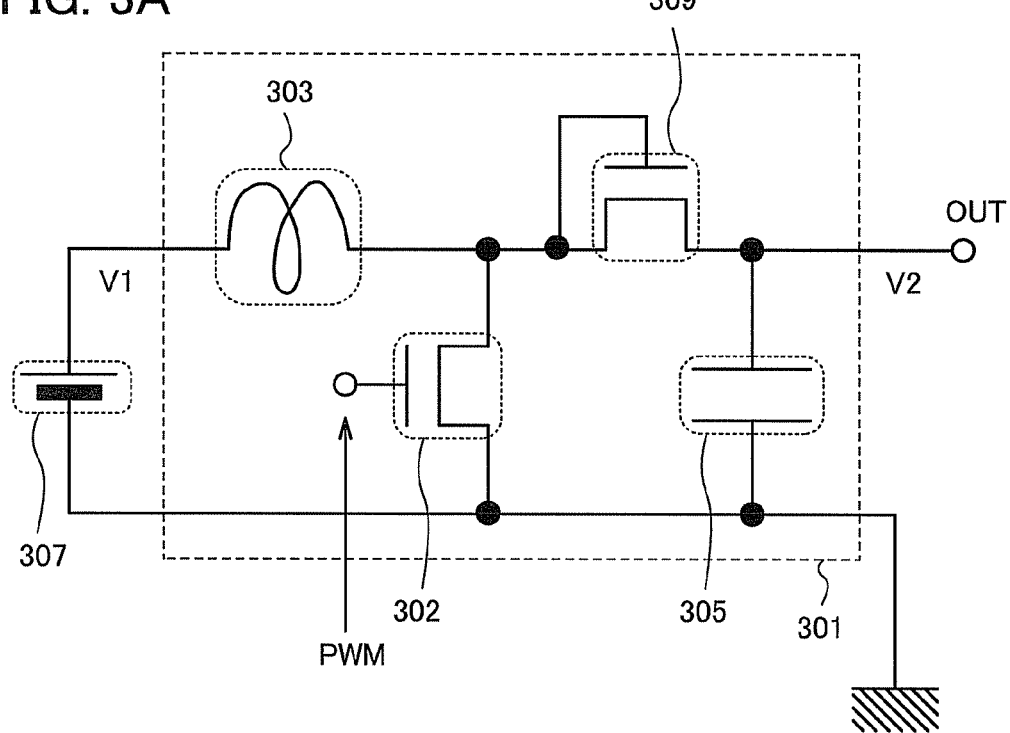
FIGS. 3A and 3B are circuit diagrams of converter circuits.

A converter circuit 301 shown in FIG. 3A is a step-up circuit including a transistor 302 which is a switching element, a coil 303, a diode 309 which is a rectifier, and a capacitor 305.

One terminal of the coil 303 is electrically connected to one of the electrodes of a photoelectric transducer element 307, which electrodes are on the n-type semiconductor layer side and on the p-type semiconductor layer side of the element. The other terminal of the coil 303 is electrically connected to one of a source and a drain of the transistor 302. The one of the source and the drain of the transistor 302 is electrically connected to the other terminal of the coil 303 and an input terminal of the diode 309. The other of the source and the drain of the transistor 302 is electrically connected to the other of the electrodes of the photoelectric transducer element 307, which electrodes are on the n-type semiconductor layer side and on the p-type semiconductor layer side of the element, and to one terminal of the capacitor 305. The other terminal of the capacitor 305 is electrically connected to an output terminal of the diode 309 and to an output terminal OUT. Note that the other of the electrodes of the photoelectric transducer element 307, which electrodes are on the n-type semiconductor layer side and on the p-type semiconductor layer side of the element, the other of the source and the drain of the transistor 302, and the one terminal of the capacitor 305 are grounded.

Note that the gate of the transistor refers to the entire or part of the gate electrode and gate wiring. The gate wiring refers to a wiring for electrically connecting at least one gate electrode of a transistor to a different electrode or different wiring.

The source of the transistor refers to the entire or part of the source region, source electrode, and source wiring. The source region refers to a region whose resistance is lower than that of a channel formation region in a semiconductor layer. The source electrode refers to part of a conductive layer, which is connected to the source region. The source wiring is a wiring for electrically connecting at least one source electrode of a transistor to a different electrode or different wiring.

The drain of the transistor refers to the entire or part of the drain region, drain electrode, and drain wiring. The drain region refers to a region whose resistance is lower than that of a channel formation region in a semiconductor layer. The drain electrode refers to part of a conductive layer, which is connected to the drain region. The drain wiring is a wiring for electrically connecting at least one drain electrode of a transistor to a different electrode or different wiring.

Further, the source and the drain of a transistor may interchange with each other depending on the structure, the operating condition, and the like of the transistor; therefore, it is difficult to define which is the source or the drain. For this reason, in this document (the specification, the claims, the drawings, or the like), one of the source and the drain is referred to as one of the source and the drain, and the other is referred to as the other of the source and the drain.

The transistor 302 functions as a switching element. A gate of the transistor 302 is connected to a control circuit of the converter circuit 301. The transistor 302 is turned on and off by a signal PWM output from the control circuit of the converter circuit 301.

When the transistor 302 which is a switching element is on, excitation energy is accumulated in the coil 303 by current flowing to the coil 303.

When the transistor 302 is turned off, excitation energy accumulated in the coil 303 is released. A voltage due to excitation energy released from the coil 303 is added to a voltage V1 to be a voltage V2. Thus, the converter circuit 301 functions as a step-up circuit.

A period in which the transistor 302 which is a switching element is on is Ton and a period in which the transistor 302 is off is Toff. The value of the output voltage V2 is expressed by Formula 1 below.

$$V2 = V1 \times (Ton + Toff)/Toff \qquad \text{(Formula 1)}$$

The longer the period Ton in which the transistor 302 is on and the larger the energy accumulated in the coil 303, the larger the power taken is.

In Embodiment 1, a transistor that is normally off and has an oxide semiconductor film including a channel formation region (hereinafter referred to as "oxide semiconductor transistor" in this specification) is used as the transistor 302. Note that the detailed structure and method of fabricating the oxide semiconductor transistor will be described later.

The oxide semiconductor film described in Embodiment 1 has a large band gap, and thus resists avalanche breakdown and hot-carrier degradation. Since the oxide semiconductor film resists hot-carrier degradation, its drain breakdown voltage is high. Since the oxide semiconductor film has a high drain breakdown voltage, the oxide semiconductor transistor is a high-breakdown-voltage and large-current transistor. For this reason, the oxide semiconductor transistor is preferably used as the transistor 302 that is a switching element in the converter circuit 301.

In Embodiment 1, the diode 309 functions as a rectifier. In Embodiment 1, a diode-connected oxide semiconductor transistor is used as the diode 309. An oxide semiconductor transistor that is similar to the transistor 302 and has a gate electrode and a drain region electrically connected to each other is used as the diode-connected oxide semiconductor transistor. The diode 309 is a diode-connected normally-on oxide semiconductor transistor. The collector current of a normally-on oxide semiconductor transistor rises soon after a gate voltage is applied to a gate electrode. Thus, a diode that is a diode-connected normally-on oxide semiconductor transistor is preferable in that it has a smaller voltage drop than a PN diode.

A normally-off oxide semiconductor transistor that is the transistor 302 and a normally-on oxide semiconductor transistor that functions as the diode 309 are different only in the film thickness of the channel formation region. The transistor 302 and the diode 309 can therefore be fabricated in the same process. Thus, the number of fabrication steps of the converter circuit 301 can be reduced. Since the number of the fabrication steps of the converter circuit 301 can be reduced, the fabrication cost of the converter circuit 301 can be reduced.

As described above, an oxide semiconductor transistor is a high-breakdown-voltage and large-current transistor. For this reason, a diode-connected oxide semiconductor transistor is preferably used as the diode 309 in the converter circuit 301.

In Embodiment 1, a coiled wire formed over a substrate can be used as the coil 303.

In Embodiment 1, a capacitor having a first electrode, a second electrode, and a dielectric, for example, can be used as the capacitor 305.

Examples of an oxide semiconductor transistor of Embodiment 1 will be described with reference to FIGS. 1A and 1B, FIGS. 2A to 2C, FIGS. 5A and 5B, FIGS. 6A to 6F, FIGS. 7A to 7D, FIGS. 8A to 8C, FIGS. 9A to 9F, and FIGS. 10A to 10F.

Figure 1B:
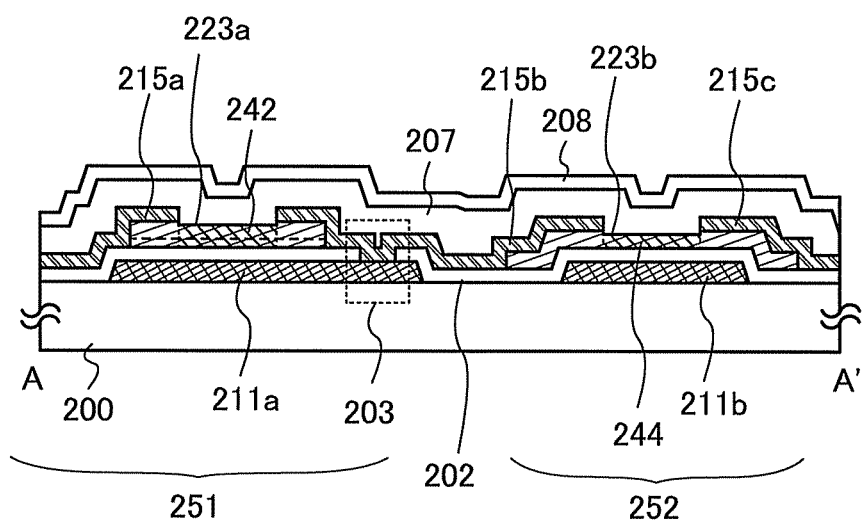

An example of the structures of oxide semiconductor transistors that can be used as the transistor 302 and the diode 309 will be described with reference to FIGS. 1A and 1B. FIG. 1A is a top view and FIG. 1B is a cross-sectional view taken along line A-A'.

An oxide semiconductor transistor 252 corresponds to the transistor 302 shown in FIG. 3A. The oxide semiconductor transistor 252 includes a gate electrode 211*b* over a substrate 200; a gate insulating layer 202 over the gate electrode 211*b*; an island-shaped oxide semiconductor layer 223*b* over the gate insulating layer 202; and a pair of electrodes of a wiring layer 215*b* and a wiring layer 215*c* in contact with the island-shaped oxide semiconductor layer 223*b*. The wiring layer 215*b* functions as one of a source electrode and a drain electrode of the oxide semiconductor transistor 252, and the wiring layer 215*c* functions as the other one of the source electrode and the drain electrode of the oxide semiconductor transistor 252. Further, an oxide insulating film 207 is formed over the island-shaped oxide semiconductor layer 223*b*. A protective insulating layer 208 is formed over the oxide insulating film 207.

In the oxide semiconductor transistor 252, a region which is included in the island-shaped oxide semiconductor layer 223*b*, overlaps with the gate electrode 211*b* with the gate insulating layer 202 interposed therebetween, and is sandwiched between the wiring layer 215*b* and the wiring layer 215*c* is a channel formation region.

In the island-shaped oxide semiconductor layer 223*b*, the thickness of a region 244 which does not overlap with the wiring layer 215*b* or the wiring layer 215*c* is smaller than the thickness of a region which overlaps with the wiring layer 215*b* or the wiring layer 215*c*. The thickness of the thin region 244 is made small by etching performed in a step of forming the wiring layer 215*b* and the wiring layer 215*c* which will be described later.

An oxide semiconductor transistor 251 corresponds to the diode 309 shown in FIG. 3A. The oxide semiconductor transistor 251 includes a gate electrode 211*a* over the substrate 200; the gate insulating layer 202 over the gate electrode 211*a*; an island-shaped oxide semiconductor layer 223*a* over the gate insulating layer 202; and a pair of electrodes of a wiring layer 215*a* and the wiring layer 215*b* in contact with the island-shaped oxide semiconductor layer 223*a*. Further, the oxide insulating film 207 is formed over the island-shaped oxide semiconductor layer 223*a*. The protective insulating layer 208 is formed over the oxide insulating film 207.

In the oxide semiconductor transistor 251, a region which is included in the island-shaped oxide semiconductor layer 223*a* overlaps with the gate electrode 211*a* with the gate insulating layer 202 interposed therebetween, and sandwiched between the wiring layer 215*a* and the wiring layer 215*b* is a channel formation region.

In the island-shaped oxide semiconductor layer 223*a*, the thickness of a region 242 which does not overlap with the wiring layer 215*a* or the wiring layer 215*b* is smaller than the thickness of a region which overlaps with the wiring layer 215*a* or the wiring layer 215*b*. The thickness of the region 242 is made small by etching performed in the step of forming the wiring layer 215*a* and the wiring layer 215*b* which will be described later.

The gate electrode 211*a* is in direct contact with the wiring layer 215*b* through a contact hole 203 formed in the gate insulating layer 202. In other words, in the oxide semiconductor transistor 251, one of the source electrode and the drain electrode is electrically connected to the gate, that is, the oxide semiconductor transistor 251 is diode-connected and functions as a diode.

The film thickness of the island-shaped oxide semiconductor layer 223*b* in the oxide semiconductor transistor 252 and the film thickness of the island-shaped oxide semiconductor layer 223*a* in the oxide semiconductor transistor 251 are made different. Each film thickness determines whether the transistor is normally off or normally on. The film thickness of the island-shaped oxide semiconductor layer 223*b* is smaller than the film thickness of the island-shaped oxide semiconductor layer 223*a*. The oxide semiconductor transistor 252 including the thin island-shaped oxide semiconductor layer 223*b* is normally off. On the other hand, the oxide semiconductor transistor 251 including the thick island-shaped oxide semiconductor layer 223*a* is normally on.

Thus, the oxide semiconductor transistor can be made normally on or normally off by only making a difference between the film thickness of the island-shaped oxide semiconductor layer 223*b* including a channel formation region and the film thickness of the island-shaped oxide semiconductor layer 223*a* including a channel formation region.

A method of fabricating the oxide semiconductor transistor 251 and the oxide semiconductor transistor 252 shown in FIGS. 1A and 1B will be described with reference to FIGS. 6A to 6F and FIGS. 7A to 7D.

Figure 6A:
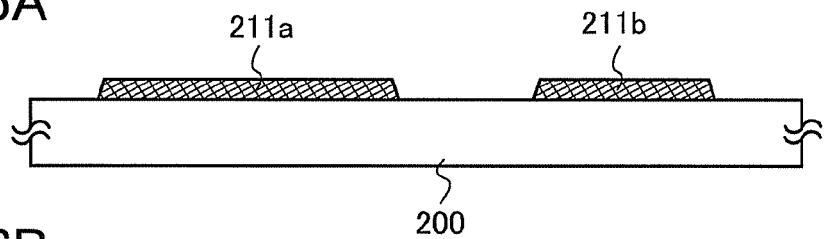
FIGS. 6A to 6F are cross-sectional views showing a method of fabricating oxide semiconductor transistors.

A conductive film is firstly formed over the substrate 200 having an insulating surface, and then the gate electrode 211*a* and the gate electrode 211*b* are formed using the conductive film (see FIG. 6A). Note that the edges of the formed gate electrodes are preferably tapered.

As a material of the conductive film used for forming the gate electrodes 211*a* and 211*b*, an element selected from Al, Cr, Ta, Ti, Mo, and W; an alloy including the above element; an alloy including any of these elements in combination; or the like can be used. The gate electrodes can also be formed using a single-layer conductive film containing a metal material such as copper, neodymium, or scandium as well as the aforementioned metal or an alloy material including the element as a main component, or a stacked layer thereof.

Note that the gate electrodes can also be formed using a light transmitting conductive film. An example of a material of the light transmitting conductive film is a light-transmitting conductive oxide.

As a glass substrate used as the substrate 200, if the temperature of the heat treatment to be performed later is high, a glass substrate having a strain point of 730° C. or higher is preferably used. In addition, examples of a glass material used for a glass substrate include aluminosilicate glass, aluminoborosilicate glass, and barium borosilicate glass.

Note that a substrate formed from an insulator such as a ceramic substrate, a quartz substrate, or a sapphire substrate may be used as the substrate 200 instead of the glass substrate. Alternatively, crystallized glass or the like can be used.

An insulating film serving as a base film may be formed between the substrate 200 and each of the gate electrodes 211a and 211b. The base film has a function of preventing diffusion of an impurity element from the substrate 200 and can be formed using one film or stacked films selected from a silicon nitride film, a silicon oxide film, a silicon nitride oxide film, and a silicon oxynitride film.

Figure 6B:
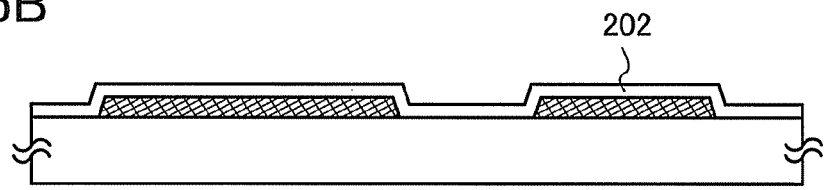

Next, the gate insulating layer 202 is formed over the gate electrodes 211a and 211b (see FIG. 6B).

The gate insulating layer 202 can be formed using a single layer or a stacked layer of a silicon oxide layer, a silicon nitride layer, a silicon oxynitride layer, and/or a silicon nitride oxide layer. Note that the layer may be doped with phosphorus (P) or boron (B).

A silicon oxide layer, a silicon nitride layer, a silicon oxynitride layer, or a silicon nitride oxide layer can be formed using a plasma CVD method, a sputtering method, or the like. For example, a silicon oxynitride layer may be formed by a plasma CVD method using $SiH_4$, oxygen, and nitrogen as deposition gases.

In Embodiment 1, the gate insulating layer 202 that is a 100-nm-thick silicon oxynitride (SiON (composition ratio: N<O)) layer is formed by a plasma CVD method.

Figure 6C:
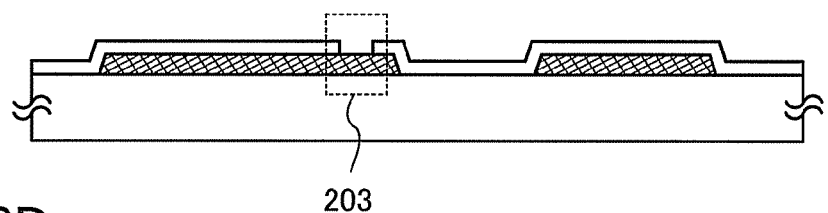

Next, the contact hole 203 is formed in the gate insulating layer 202 by selectively etching the gate insulating layer 202 (see FIG. 6C). Note that the contact hole 203 reaches the gate electrode 211a.

Note that after the contact hole 203 is formed, it is preferable that the gate insulating layer 202 be subjected to heat treatment (at 400° C. or higher and lower than a strain point of the substrate) in an inert gas atmosphere (nitrogen, helium, neon, argon, or the like). By this heat treatment, impurities such as hydrogen and water contained in the gate insulating layer 202 can be eliminated before an oxide semiconductor film is formed.

Then, a method of fabricating oxide semiconductor films including channel formation regions of the oxide semiconductor transistor 251 and the oxide semiconductor transistor 252 and having different thicknesses will be described.

In Embodiment 1, the thick island-shaped oxide semiconductor layer 223a is formed over the gate electrode 211a with the gate insulating layer 202 interposed therebetween. The thin island-shaped oxide semiconductor layer 223b is formed over the gate electrode 211b with the gate insulating layer 202 interposed therebetween. Note that in Embodiment 1, the film formation method in which an oxide semiconductor layer is stacked over an island-shaped oxide semiconductor layer will be described as an example of the method for forming the thick island-shaped oxide semiconductor layer 223a over the gate electrode 211a.

Figure 6D:
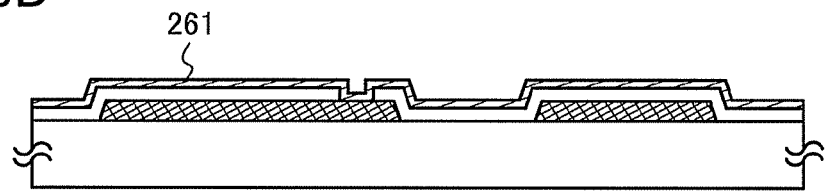

First, an oxide semiconductor layer 261 is formed over the gate electrode 211a with the gate insulating layer 202 interposed therebetween (see FIG. 6D).

The oxide semiconductor layer 261 includes at least one element selected from In, Ga, Sn, Zn, Al, Mg, Hf and lanthanoid. A quaternary metal oxide such as an In—Sn—Ga—Zn—O-based oxide semiconductor; a ternary metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor layer, a Sn—Al—Zn—O-based oxide semiconductor, an In—Hf—Zn—O-based oxide semiconductor, an In—La—Zn—O-based oxide semiconductor, an In—Ce—Zn—O-based oxide semiconductor, an In—Pr—Zn—O-based oxide semiconductor, an In—Nd—Zn—O-based oxide semiconductor, an In—Pm—Zn—O-based oxide semiconductor, an In—Sm—Zn—O-based oxide semiconductor, an In—Eu—Zn—O-based oxide semiconductor, an In—Gd—Zn—O-based oxide semiconductor, an In—Tb—Zn—O-based oxide semiconductor, an In—Dy—Zn—O-based oxide semiconductor, an In—Ho—Zn—O-based oxide semiconductor, an In—Er—Zn—O-based oxide semiconductor, an In—Tm—Zn—O-based oxide semiconductor, an In—Yb—Zn—O-based oxide semiconductor, or an In—Lu—Zn—O-based oxide semiconductor; a binary metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based material; or a unary metal oxide such as an In—O-based oxide semiconductor, a Sn—O-based oxide semiconductor, or a Zn—O-based oxide semiconductor can be used, for example. Alternatively, an element other than In, Ga, Sn, Zn, Al, Mg, Hf and lanthanoid e.g., $SiO_2$ can be used.

For example, an In—Ga—Zn—O-based oxide semiconductor means an oxide semiconductor containing indium (In), gallium (Ga), and zinc (Zn), and there is no limitation on the composition ratio thereof.

For the oxide semiconductor layer, a thin film expressed by the chemical formula $InMO_3(ZnO)_m$ (m>0) can be used. Here, M is one or more metal elements selected from Zn, Ga, Al, Mn, and Co. M can be Ga, Ga and Al, Ga and Mn, Ga and Co, or the like.

In the case where an In—Zn—O-based material is used as the oxide semiconductor, a target therefore has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, a target used for the formation of an In—Zn—O-based oxide semiconductor has an atomic ratio expressed by the equation Z>1.5X+Y where In:Zn:O=X:Y:Z.

The oxide semiconductor layer 261 can be formed by a sputtering method in a rare gas (typically argon) atmosphere, an oxygen atmosphere, or an atmosphere including a rare gas (typically argon) and oxygen. When the oxide semiconductor layer 261 is formed using a sputtering method, the oxide semiconductor layer 261 is formed using a target containing $SiO_2$ at 2 wt % to 10 wt %. If the oxide semiconductor layer 261 is formed using a target containing $SiO_2$, $SiO_x$ (X>0) that inhibits crystallization can be contained in the oxide semiconductor layer 261. Setting $SiO_x$ contained in the oxide semiconductor layer 261 is preferable in that it can prevent the oxide semiconductor layer 261 from being crystallized at the time of heat treatment aimed at dehydration or dehydrogenation which is performed later.

In Embodiment 1, the oxide semiconductor layer is formed using an oxide semiconductor target including In, Ga, and Zn ($In_2O_3$:$Ga_2O_3$:ZnO=1:1:1) under the conditions where the distance between the substrate and the target is 100 mm, the pressure is 0.6 Pa, the direct-current (DC) power is 0.5 kW, and the atmosphere is oxygen (the proportion of the oxygen flow is 100%). Note that a pulsed direct-current (DC) power source is preferable because dust can be reduced and the film thickness can be uniform. In Embodiment 1, as the oxide semiconductor layer 261, an In—Ga—Zn—O-based non-single-crystal film is formed by a sputtering method using an In—Ga—Zn—O-based oxide semiconductor target.

In Embodiment 1, the oxide semiconductor layer is formed so that the thickness of a stack of the oxide semiconductor layer 261 and an oxide semiconductor layer 262, which will be described later, is preferably in the range of 50 nm to 100 nm. Note that an appropriate thickness differs depending on an oxide semiconductor material, and the thickness may be set as appropriate depending on the material.

Figure 6E:
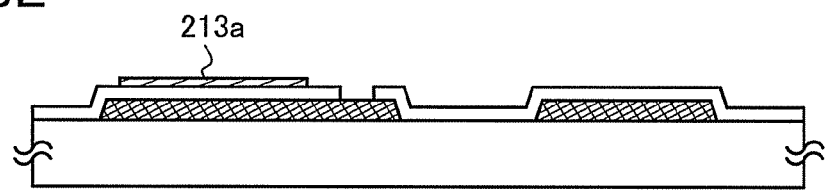

Next, the island-shaped oxide semiconductor layer 213a is formed by processing the oxide semiconductor layer 261 into an island shape (see FIG. 6E). Note that after the island-shaped oxide semiconductor layer 213a is formed, the island-shaped oxide semiconductor layer 213a may be subjected to heat treatment (at 400° C. or higher and lower than 750° C.) in an inert gas atmosphere (e.g., nitrogen, helium, neon, or argon). When the island-shaped oxide semiconductor layer 213a is heated in an inert gas atmosphere, impurities such as hydrogen and water contained in the island-shaped oxide semiconductor layer 213a can be removed. It is preferable that the oxide semiconductor layer 262 which will be described later be formed after impurities such as hydrogen and water contained in the island-shaped oxide semiconductor layer 213a are removed.

Figure 6F:
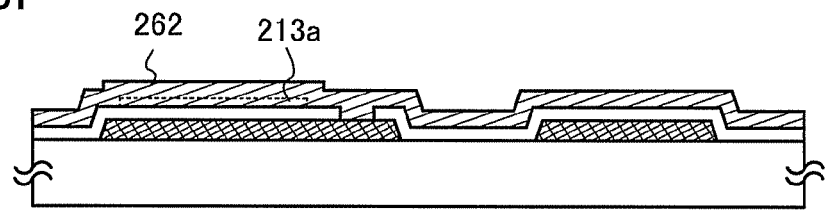

Then, the oxide semiconductor layer 262 covering the island-shaped oxide semiconductor layer 213a, the gate insulating layer 202, and the gate electrode 211a is formed (see FIG. 6F). In Embodiment 1, an In—Ga—Zn—O-based non-single-crystal film is formed as the oxide semiconductor layer 262. The oxide semiconductor layer 262 preferably has a thickness of 5 nm to 30 nm. Note that an appropriate thickness differs depending on an oxide semiconductor material, and the thickness may be set as appropriate depending on the material.

Over the gate electrode 211a, the oxide semiconductor layer 262 is stacked over the island-shaped oxide semiconductor layer 213a, forming a thick oxide semiconductor layer. On the other hand, over the gate electrode 211b, the oxide semiconductor layer 262 is formed in contact with the gate insulating layer 202, forming a thin oxide semiconductor layer.

Next, a stack of the island-shaped oxide semiconductor layer 213a and the oxide semiconductor layer 262 is processed into an island shape. Thus, the thick island-shaped oxide semiconductor layer 223a is formed over the gate electrode 211a. Further, the thin island-shaped oxide semiconductor layer 223b is formed over the gate electrode 211b (see FIG. 7A).

The island-shaped oxide semiconductor layer 223a is a stack of the island-shaped oxide semiconductor layer 213a and an island-shaped oxide semiconductor layer 213b. The island-shaped oxide semiconductor layer 213b can be provided by processing the oxide semiconductor layer 262 into an island shape. The island-shaped oxide semiconductor layer 223b can be provided by processing the oxide semiconductor layer 262 into an island shape.

Thus, the thick island-shaped oxide semiconductor layer 223a and the thin island-shaped oxide semiconductor layer 223b can be provided. The film thickness of the island-shaped oxide semiconductor layer 223b, that is, the film thickness of the oxide semiconductor layer 262 is controlled so that the oxide semiconductor transistor 252 serving as a switching element in the converter circuit may be normally off. Further, the film thickness of the island-shaped oxide semiconductor layer 223a is controlled so that the oxide semiconductor transistor 251 serving as a rectifier in the converter circuit may be normally on. As described above, the film thickness of the island-shaped oxide semiconductor layer 213b included in the island-shaped oxide semiconductor layer 223a is the same as that of the oxide semiconductor layer 262. For this reason, to control the film thickness of the island-shaped oxide semiconductor layer 223a, the film thickness of the island-shaped oxide semiconductor layer 213a, that is, the film thickness of the oxide semiconductor layer 261 needs to be controlled.

Note that, in some cases, the characteristics of the oxide semiconductor transistor 252 cannot be controlled only by the film thickness of the island-shaped oxide semiconductor layer 223, causing the oxide semiconductor transistor 252 including the island-shaped oxide semiconductor layer 223b to be normally on. In these cases, heat treatment may be performed, after the oxide insulating film 207 which is formed in a later step is formed, to increase the resistance of part of a channel formation region formed in the island-shaped oxide semiconductor layer 223b. A method of increasing the resistance of part of the channel formation region will be described later.

Although the oxide semiconductor layer 262 is formed after the contact hole 203 in the gate insulating layer 202 is formed in Embodiment 1, there is no limitation on the sequence of forming the contact hole 203 and the oxide semiconductor layer 262.

For example, after the oxide semiconductor layer 262 is etched, a resist mask may be formed over the oxide semiconductor layer 262, and the contact hole 203 reaching the gate electrode 211a may be formed by the etching of the gate insulating layer 202. In this case, reverse sputtering is preferably performed to remove a resist residue or the like from a surface of the oxide semiconductor layer 262 and the gate insulating layer 202.

Alternatively, after the oxide semiconductor layer 262 is formed, a resist mask may be formed over the oxide semiconductor layer 262, and the contact hole 203 reaching the gate electrode 211a may be formed by the etching of the oxide semiconductor layer 262 and the gate insulating layer 202. After the contact hole 203 is formed, the resist mask may be removed and the oxide semiconductor layer 262 may be processed into the island-shaped oxide semiconductor layer 213b, by forming a resist mask over the oxide semiconductor layer 262 using another photomask, and selectively etching the oxide semiconductor layer 262.

Next, the island-shaped oxide semiconductor layers 223a and 223b are subjected to dehydration or dehydrogenation. A first heat treatment for dehydration or dehydrogenation is performed at 400° C. or higher and lower than 750° C., preferably, at 425° C. or higher and lower than 750° C. Note that the first heat treatment performed at 425° C. or higher requires a heat treatment time of one hour or less, whereas the first heat treatment performed at 425° C. or lower requires a heat treatment time of more than one hour. Here, the substrate is introduced into an electric furnace, and the heat treatment of the oxide semiconductor layers is performed in a nitrogen atmosphere. After that, the oxide semiconductor layers are prevented from being exposed to air, which prevents water or hydrogen from re-entering the oxide semiconductor layers; thus, the oxide semiconductor layers are obtained. In Embodiment 1, one furnace is continuously used during the heat treatment up to the time when the temperature is lowered from the heating temperature T for dehydration or dehydrogenation of the oxide semiconductor layers to a temperature at which water does not re-enter. Specifically, slow cooling is performed in a nitrogen atmosphere up to the time when the temperature becomes lower than the heating temperature T by 100° C. or more. Without limitation to a nitrogen atmosphere, dehydration or dehydrogenation is performed in a noble gas (such as helium, neon, argon, or the like).

In addition, in the first heat treatment, it is preferable that nitrogen or the noble gas such as helium, neon, or argon do not include water, hydrogen, or the like. Alternatively, it is preferable that nitrogen or a noble gas such as helium, neon, or argon introduced into the heat treatment apparatus have a purity of 6N (99.9999%) or more, preferably, 7N (99.99999%) or more (in other words, the impurity concentration be set to 1 ppm or lower, preferably, 0.1 ppm or lower).

Note that the oxide semiconductor layers are crystallized and changed into microcrystalline films or polycrystalline films in some cases depending on the conditions of the first heat treatment or the material of the oxide semiconductor layers. For example, the oxide semiconductor layers may be crystallized into microcrystalline oxide semiconductor films having a degree of crystallization of 90% or more, or 80% or more. Further, depending on the conditions of the first heat treatment or the material of the oxide semiconductor layers, the oxide semiconductor layers may be amorphous oxide semiconductor films containing no crystalline component.

The oxide semiconductor layers are changed to oxygen-deficient and low-resistance oxide semiconductor layers after the first heat treatment. An oxide semiconductor film after the first heat treatment is performed has a higher carrier concentration than the oxide semiconductor film shortly after the formation and preferably has a carrier concentration of $1 \times 10^{18}/cm^3$ or more.

Figure 7A:
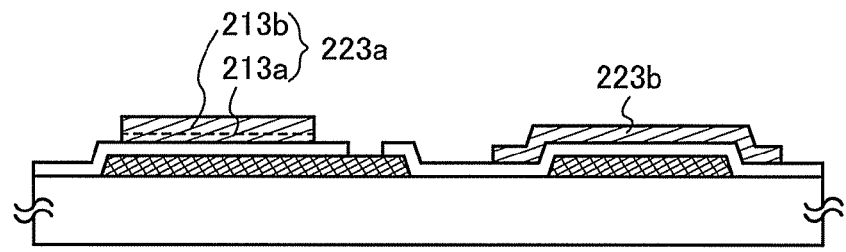
FIGS. 7A to 7D are cross-sectional views showing the method of fabricating the oxide semiconductor transistors.
Figure 7B:
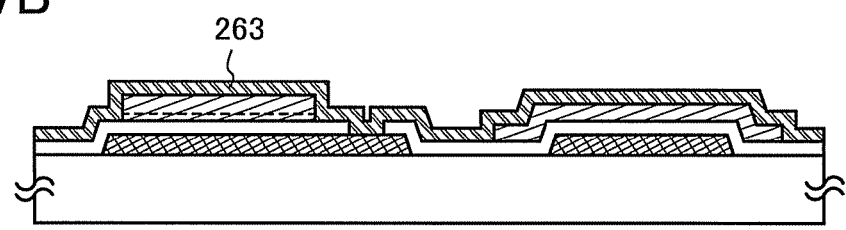

Next, a conductive film 263 covering the gate insulating layer 202, the island-shaped oxide semiconductor layer 223a, the island-shaped oxide semiconductor layer 223b, and the contact hole 203 is formed (see FIG. 7B).

A material of the conductive film 263 is an element selected from titanium (Ti), molybdenum (Mo), tungsten (W), aluminum (Al), chromium (Cr), copper (Cu), and tantalum (Ta); an alloy containing any of these elements as a component; an alloy containing any of these elements in combination; or the like. The conductive film 263 is not necessarily a single layer containing the above-described element and may be a stack of two or more layers. In Embodiment 1, a three-layer conductive film in which a 100-nm-thick titanium film, a 200-nm-thick aluminum film, and a 100-nm-thick titanium film are stacked is formed as the conductive film 263. Instead of a titanium film, a titanium nitride film may be used.

Figure 7C:
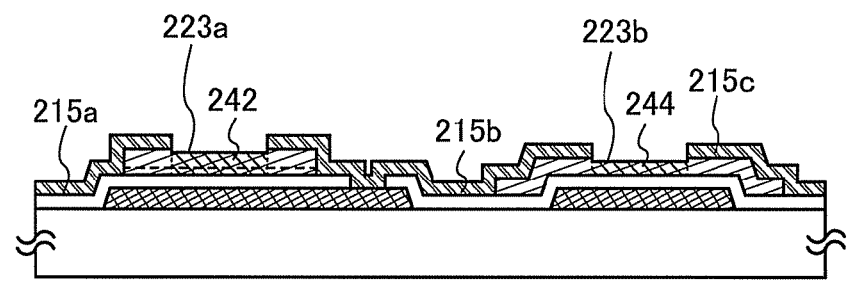

Next, the conductive film 263 is selectively removed by etching to form the wiring layer 215a, the wiring layer 215b, and the wiring layer 215c each serving as a source electrode layer or a drain electrode layer (see FIG. 7C). As shown in FIG. 7C, the gate electrode 211a and the wiring layer 215b are in direct contact with each other in the contact hole 203.

In the step of selectively removed by etching the conductive film 263, an exposed region of the island-shaped oxide semiconductor layer 223a and an exposed region of the island-shaped oxide semiconductor layer 223b (a region where the wiring layer 215a or the wiring layer 215b and the island-shaped oxide semiconductor layer 223a do not overlap with each other, and a region where the wiring layer 215b or the wiring layer 215c and the island-shaped oxide semiconductor layer 223b do not overlap with each other) are etched in some cases.

In these cases, the region 242 of the island-shaped oxide semiconductor layer 223a which does not overlap with the wiring layer 215a or the wiring layer 215b has a smaller film thickness than a region of the island-shaped oxide semiconductor layer 223a which overlaps with the wiring layer 215a or the wiring layer 215b.

The region 244 of the island-shaped oxide semiconductor layer 223b which does not overlap with the wiring layer 215b or the wiring layer 215c has a smaller film thickness than a region of the island-shaped oxide semiconductor layer 223b which overlaps with the wiring layer 215b or the wiring layer 215c (see FIG. 7C).

In the oxide semiconductor transistor 251, a region which is included in the island-shaped oxide semiconductor layer 223a overlaps with the gate electrode 211a with the gate insulating layer 202 interposed therebetween, and sandwiched between the wiring layer 215a and the wiring layer 215b is a channel formation region. In the oxide semiconductor transistor 252, a region which is included in the island-shaped oxide semiconductor layer 223b overlaps with the gate electrode 211b with the gate insulating layer 202 interposed therebetween, and sandwiched between the wiring layer 215c and the wiring layer 215b is a channel formation region.

Figure 7D:
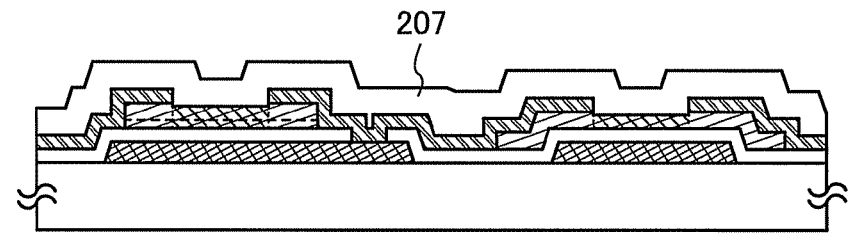

Then, the oxide insulating film 207 covering the gate insulating layer 202, the island-shaped oxide semiconductor layer 223a, and the island-shaped oxide semiconductor layer 223b is formed (see FIG. 7D). Thus, a region in contact with the oxide insulating film 207 is formed in each of the island-shaped oxide semiconductor layer 223a and the island-shaped oxide semiconductor layer 223b.

The oxide insulating film 207 is formed to a thickness of at least 1 nm. The oxide insulating film 207 can be formed as appropriate by a method, such as a sputtering method, which can prevent impurities such water and hydrogen from entering the oxide insulating film 207. In Embodiment 1, a silicon oxide film is formed as the oxide insulating film 207 by a sputtering method.

The substrate temperature in the film formation of the oxide insulating film 207 is higher than or equal to room temperature and lower than or equal to 300° C. The substrate temperature in the film formation of the oxide insulating film 207 is 100° C. in Embodiment 1. The oxide insulating film 207 can be formed by a sputtering method in a noble gas (typically, argon) atmosphere, an oxygen atmosphere, or a noble gas (typically, argon) and oxygen atmosphere. Moreover, a silicon oxide target or a silicon target can be used as a target. For example, with the use of a silicon target, a silicon oxide film can be formed by a sputtering method in an oxygen and noble gas atmosphere. As the oxide insulating film which is formed in contact with the oxide semiconductor layer whose resistance has been lowered, an inorganic insulating film which does not contain impurities such as moisture, hydrogen ions, and a hydroxide ion ($OH^-$) and which blocks the entry of these impurities from the outside is used. Typical examples of such an inorganic insulating film include a silicon oxide film, a silicon nitride oxide film, an aluminum oxide film, and an aluminum oxynitride film. Note that an oxide insulating film formed by a sputtering method is particularly dense and even a single layer thereof can be used as a protective film for suppressing diffusion of impurities. In addition, phosphorus (P) or boron (B) can be added to the oxide insulating film by using a target doped with phosphorus (P) or boron (B).

Note that the oxide insulating film 207 is formed on and in contact with the channel formation regions in the oxide semiconductor layers, and functions as a channel protective layer.

As described above, in some cases, the characteristics of the oxide semiconductor transistor 252 is not controlled only by the film thickness of the channel formation region formed in the island-shaped oxide semiconductor layer 223b, causing the oxide semiconductor transistor 252 including the island-shaped oxide semiconductor layer 223b to be normally on. In these cases, the resistance of part of the channel formation region formed in the island-shaped oxide semiconductor layer 223b is increased as stated above. A method of increasing the resistance of part of the channel formation region formed in the island-shaped oxide semiconductor layer 223b will be described below.

A second heat treatment (preferably, at 200° C. to 400° C., for example, at 250° C. to 350° C.) is performed in an inert gas atmosphere or in a nitrogen gas atmosphere after the oxide insulating film 207 is formed. For example, the second heat treatment is performed at 250° C. for one hour in a nitrogen atmosphere. By the second heat treatment, part of the island-shaped oxide semiconductor layer 223a and part of the island-shaped oxide semiconductor layer 223b are heated while being in contact with the oxide insulating film 207. The other part of the oxide semiconductor layer 223a and the other part of the oxide semiconductor layer 223b are heated while being in contact with the wiring layers 215a, 215b, and 215c.

By the first heat treatment, the resistances of the island-shaped oxide semiconductor layer 223a and the island-shaped oxide semiconductor layer 223b are reduced. The island-shaped oxide semiconductor layer 223a and island-shaped oxide semiconductor layer 223b with a reduced resistance are subjected to the second heat treatment while being in contact with the oxide insulating film 207.

The second heat treatment causes a region where each of the island-shaped oxide semiconductor layer 223a and the island-shaped oxide semiconductor layer 223b is in contact with the oxide insulating film 207 to have excessive oxygen. As a result, the island-shaped oxide semiconductor layer 223a and the island-shaped oxide semiconductor layer 223b are increased in resistance (made i-type), which phenomenon proceeds from the oxide insulating film 207 side in the depth direction of the island-shaped oxide semiconductor layer 223a and the island-shaped oxide semiconductor layer 223b.

Specifically, a region of the thin island-shaped oxide semiconductor layer 223b from a surface in contact with the oxide insulating film 207 to a surface in contact with the gate insulating layer 202 is increased in resistance (made i-type).

In the thick island-shaped oxide semiconductor layer 223a also, which is a stack of the island-shaped oxide semiconductor layer 213a and the island-shaped oxide semiconductor layer 213b, a region from a surface in contact with the oxide insulating film 207 to a surface in contact with the gate insulating layer 202 is increased in resistance (made i-type).

However, since the island-shaped oxide semiconductor layer 223a is thick, the phenomenon where the layer is increased in resistance (made i-type) stops before reaching the vicinity of a surface in contact with the gate insulating layer 202, so that a region with a low resistance is left in the island-shaped oxide semiconductor layer 223a.

As described above, even when the characteristics of the oxide semiconductor transistor 252 is not controlled only by the film thickness of the channel formation region formed in the island-shaped oxide semiconductor layer 223b and the oxide semiconductor transistor 252 is made normally on, the film thickness of the channel formation region formed in the island-shaped oxide semiconductor layer 223b can be reduced by the second heat treatment. Thus, the oxide semiconductor transistor 252 can be made normally off.

When metal conductive films are used as the wiring layer 215a, the wiring layer 215b, and the wiring layer 215c, oxygen is allowed to move easily to the metal conductive film side by performing the second heat treatment on a region where the wiring layer 215a and the island-shaped oxide semiconductor layer 223a in contact with each other; a region where the wiring layer 215b and the island-shaped oxide semiconductor layer 223a in contact with each other; a region where the wiring layer 215b and the island-shaped oxide semiconductor layer 223b in contact with each other; and a region where the wiring layer 215c and the island-shaped oxide semiconductor layer 223b in contact with each other. The movement of oxygen to the metal conductive film side causes the island-shaped oxide semiconductor layer 223a and the island-shaped oxide semiconductor layer 223b to be n-type. When the island-shaped oxide semiconductor layer 223a and the island-shaped oxide semiconductor layer 223b each have a film thickness of 30 nm or more, the vicinity of an interface between the metal conductive film and the island-shaped oxide semiconductor layer is made n-type. The lower side of the n-type region of the island-shaped oxide semiconductor layer is i-type or n⁻-type.

Next, the protective insulating layer 208 is formed over the oxide insulating film 207 (see FIG. 1B). As the protective insulating layer 208, a silicon nitride film, a silicon nitride oxide film, an aluminum nitride film, or the like is used. In Embodiment 1, a silicon nitride film is formed as the protective insulating layer 208 by an RF sputtering method.

Through the above process, two kinds of thin film transistors whose channel formation regions have different film thicknesses, the oxide semiconductor transistor 251 and the oxide semiconductor transistor 252, are fabricated over the same substrate. The oxide semiconductor transistor 252 whose channel formation region is thin behaves as a normally off transistor. In contrast, the oxide semiconductor transistor 251 whose channel formation region is thick behaves as a normally on transistor.

As described above, in the oxide semiconductor transistor 251, the gate electrode 211a is in direct contact with the wiring layer 215b through a contact hole 203 formed in the gate insulating layer 202. In other words, in the oxide semiconductor transistor 251, one of the source and the drain is electrically connected to the gate i.e., the oxide semiconductor transistor 251 is diode-connected and functions as a diode.

The benefits of using a normally-off oxide semiconductor transistor as a transistor serving as a switching element, and a diode-connected normally-on oxide semiconductor transistor as a diode will be described below.

As described in SUMMARY OF THE INVENTION, a voltage drop occurs across a PN diode when a voltage is applied to the PN diode. A forward voltage drop across a PN diode ranges from 0.6 eV to 0.8 eV.

However, the collector current Ic of a normally-on oxide semiconductor transistor rises soon after a gate voltage Vg is applied to a gate electrode. Therefore, a diode that is a diode-connected normally-on oxide semiconductor transistor is preferable in that it has a smaller voltage drop than a PN diode.

A diode-connected normally-on oxide semiconductor transistor has a smaller voltage drop than a PN diode, and thus needs a low voltage applied to compensate a voltage drop. A diode-connected normally-on oxide semiconductor transistor needs a low voltage to compensate a voltage drop, and thus achieves the low power consumption of the photoelectric transducer device.

Thus, the use of a diode-connected normally-on oxide semiconductor transistor as a diode is preferable in that it reduces a voltage drop, needs a low voltage to compensate a voltage drop, and reduces the power consumption of the photoelectric transducer device.

Figure 4:
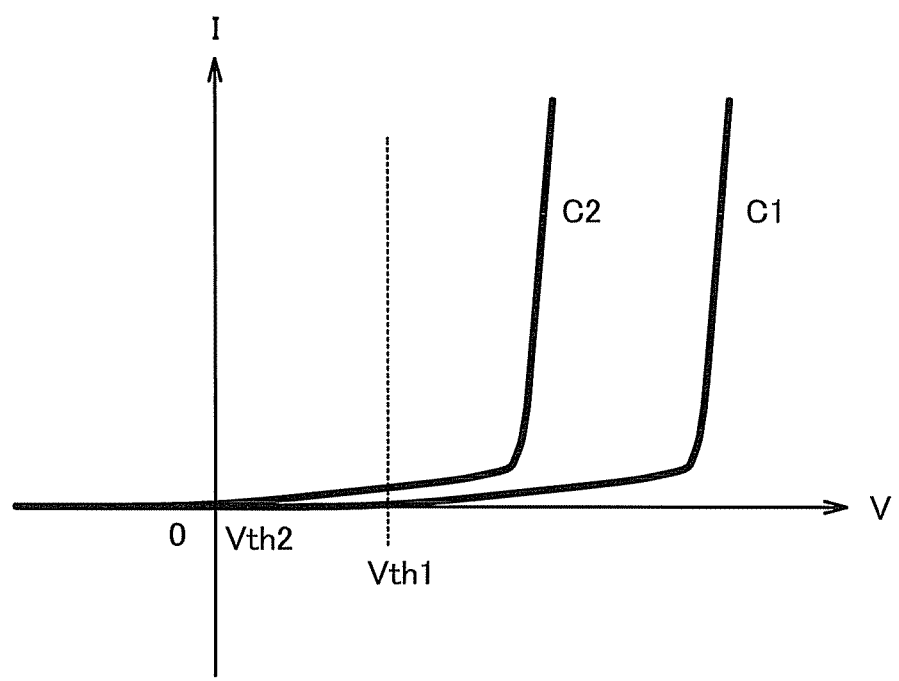
FIG. 4 is a diagram showing a difference between a normally-on transistor and a normally-off transistor.

FIG. 4 shows V-I curve C1 of a normally-off oxide semiconductor transistor and V-I curve C2 of a normally-on oxide semiconductor transistor. A threshold voltage Vth1 of the normally-off oxide semiconductor transistor is larger than 0 (Vth1>0), and a threshold voltage Vth2 of the normally-on oxide semiconductor transistor is equal to or smaller than 0 (Vth2≤0). Note that the leak current of the normally-on oxide semiconductor transistor becomes larger as the threshold voltage Vth2 of the normally-on oxide semiconductor transistor becomes negatively higher. Therefore, it is more preferable that the threshold voltage Vth2 of the normally-on oxide semiconductor transistor be around equal to 0 (Vth2≈0).

Thus, the oxide semiconductor transistor can be made normally on or normally off by changing the film thickness of the island-shaped oxide semiconductor layer including the channel formation region without changing the structure of the oxide semiconductor transistor.

Consequently, the transistor serving as a switching element and the diode serving as a rectifier which are included in a converter circuit can be fabricated using the same materials and in the same process.

Note that there are a variety of methods for forming oxide semiconductor layers having different thicknesses in addition to the above-mentioned method.

A method for forming a thin oxide semiconductor layer and a thick oxide semiconductor layer by etching will be described below with reference to FIGS. 9A to 9F.

Figure 9A:
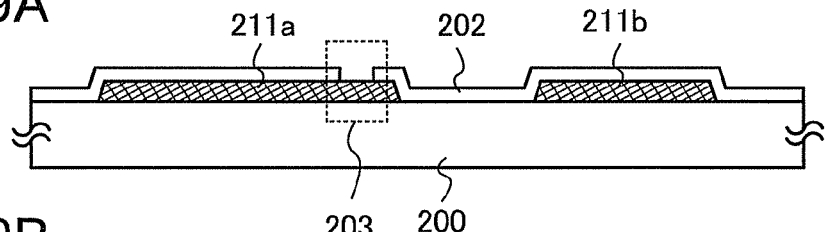
FIGS. 9A to 9F are cross-sectional views showing a method of fabricating oxide semiconductor transistors.

First, the fabrication process up to the formation of the contact hole 203 which is shown in FIG. 6C is performed in accordance with the above description (see FIG. 9A). Note that FIG. 9A and FIG. 6C are the same.

Figure 9B:
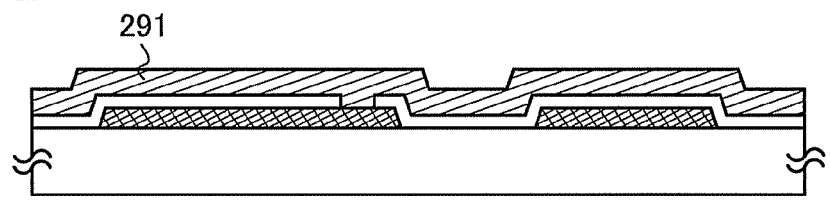

Next, a thick oxide semiconductor layer 291 covering the gate insulating layer 202 and the contact hole 203 is formed (see FIG. 9B). Note that the film thickness of the oxide semiconductor layer 291 corresponds to the film thickness of the thick island-shaped oxide semiconductor layer 223a.

Figure 9C:
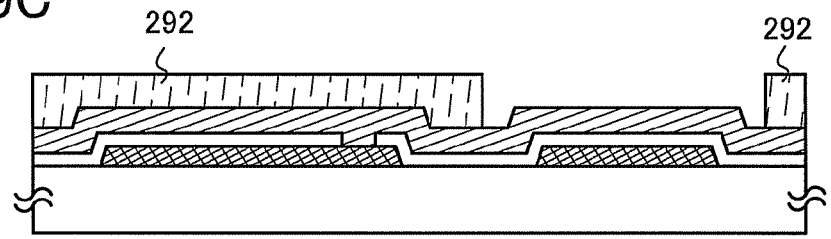
Figure 9D:
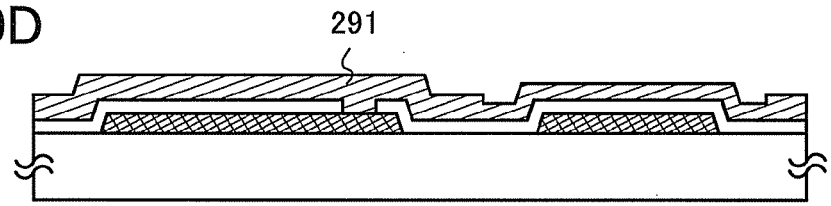

After the oxide semiconductor layer 291 is formed, a resist mask 292 is formed over the oxide semiconductor layer 291 (see FIG. 9C). The resist mask 292 is formed so that the resist mask 292 covers the gate electrode 211a and part of the oxide semiconductor layer 291 over the gate electrode 211b is exposed. In other words, the resist mask 292 is formed so that the resist mask 292 covers a region other than a region where the island-shaped oxide semiconductor layer 223b is formed in a later step and a region where the island-shaped oxide semiconductor layer 223b is formed in a later step is exposed.

Next, the exposed region of the oxide semiconductor layer 291 is etched carefully to reduce the film thickness of the region to a predetermined value, thereby thinning the region. This allows the oxide semiconductor layer 291 over the gate electrode 211a to be kept thick and the oxide semiconductor layer 291 over the gate electrode 211b to be thin (see FIG. 9D). Note that the film thickness of the thinned region of the oxide semiconductor layer 291 corresponds to the film thickness of the thin island-shaped oxide semiconductor layer 223b.

Figure 9E:
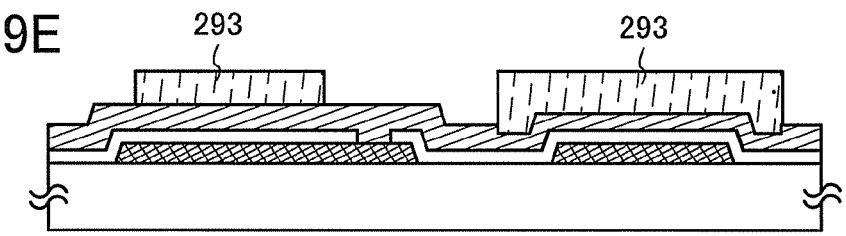

Then, the resist mask 292 is removed and a resist mask 293 is formed over the oxide semiconductor layer 291 (see FIG. 9E). The resist mask 293 covers part of a region over the gate electrode 211a and covers the thinned region over the gate electrode 211b. In other words, the resist mask 293 covers a region where the island-shaped oxide semiconductor layer 223a is formed in a later step and a region where the island-shaped oxide semiconductor layer 223b is formed in a later step.

Figure 9F:
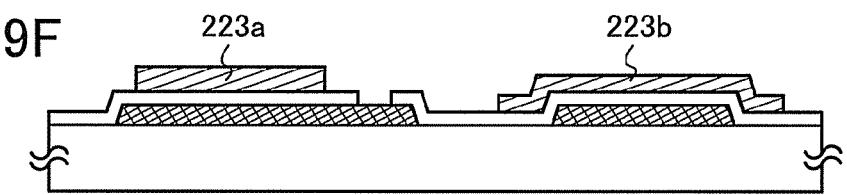

Subsequently, the oxide semiconductor layer 291 is etched using the resist mask 293, forming the thick island-shaped oxide semiconductor layer 223a and the thin island-shaped oxide semiconductor layer 223b (see FIG. 9F). After the island-shaped oxide semiconductor layer 223a and the island-shaped oxide semiconductor layer 223b are formed, the oxide semiconductor transistor 251 and the oxide semiconductor transistor 252 are formed in the above fabrication process.

In the above method, a resist mask formed using a multi-tone mask can also be used. A multi-tone mask can achieve three levels of light exposure to obtain an exposed portion, a half-exposed portion, and an unexposed portion; one-time exposure and development process enables a resist mask with regions of plural thicknesses (typically, two kinds of thicknesses) to be formed. Thus, the use of a multi-tone mask allows the number of photomasks to be reduced. Typical examples of multi-tone masks include a gray-tone mask and a half-tone mask.

A gray-tone mask includes a light-transmitting substrate and a light-blocking portion and a diffraction grating which are provided over the light-transmitting substrate. The light transmittance of the light-blocking portion is 0%. On the other hand, the diffraction grating has a light-transmitting portion in a slit form, a dot form, a mesh form, or the like with intervals which are less than or equal to the resolution limit of light used for the light exposure; thus, light transmittance can be controlled. Note that the diffraction grating can be either in a regular slit form, a regular dot form, or a regular mesh form, or in an irregular slit form, an irregular dot form, or an irregular mesh form.

As the light-transmitting substrate, a light-transmitting substrate such as a quartz substrate can be used. The light-blocking portion and the diffraction grating can be formed using a light-blocking material which absorbs light, such as chromium or chromium oxide.

When the gray-tone mask is irradiated with light for exposure, the light transmittance of the light-blocking portion is 0% and that of a region where neither the light-blocking portion nor the diffraction grating is provided is 100%. The light transmittance of the diffraction grating can be set in the range of 10% to 70%. The light transmittance of the diffraction grating can be controlled by controlling the interval and pitch of the slits, dots, or mesh of the diffraction grating.

A half-tone mask includes a light-transmitting substrate and a semi-light-transmitting portion and a light-blocking portion which are provided over the light-transmitting substrate. The semi-light-transmitting portion can be formed using MoSiN, MoSi, MoSiO, MoSiON, CrSi, or the like. The light-blocking portion can be formed using a light-blocking material which absorbs light, such as chromium or chromium oxide.

When the half-tone mask is irradiated with light for exposure, the light transmittance of the light-blocking portion is 0% and the light transmittance of a region where neither the light-blocking portion nor the semi-light-transmitting portion is provided is 100%. The light transmittance of the semi-light-transmitting portion can be set in the range of 10% to 70%. The light transmittance of the semi-light-transmitting portion can be controlled with the material of the semi-light-transmitting portion.

After light exposure using the multi-tone mask, a resist mask having regions with different thicknesses can be formed.

A method for forming island-shaped oxide semiconductor layers having different film thicknesses by using resist masks having different film thicknesses will be described with reference to FIGS. 10A to 10F.

Figure 10A:
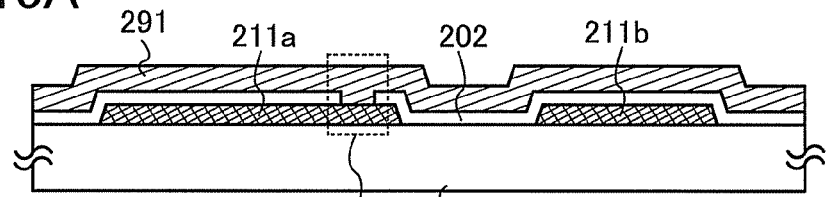
FIGS. 10A to 10F are cross-sectional views showing the method of fabricating the oxide semiconductor transistors.

First, the fabrication process up to the formation of the thick oxide semiconductor layer 291 shown in FIG. 9B is performed in accordance with the above description (see FIG. 10A). Note that FIG. 10A and FIG. 9B are the same.

Figure 10B:
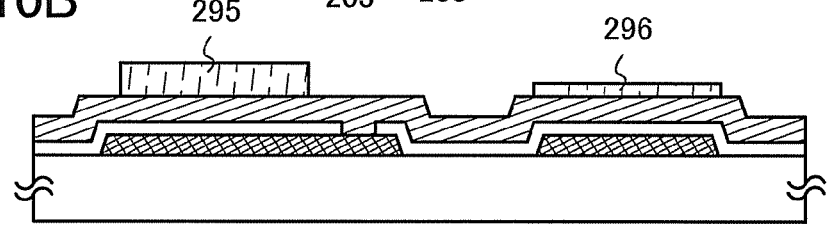
Figure 10C:
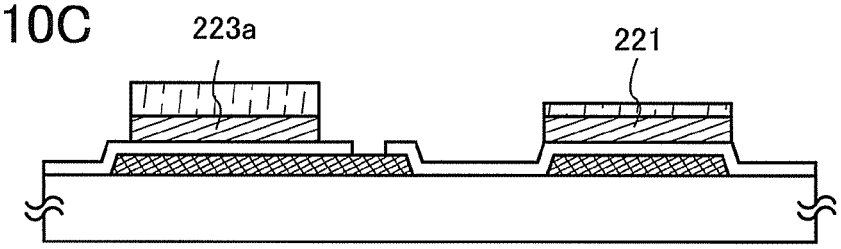

A thick resist mask 295 and a thin resist mask 296 are formed over the oxide semiconductor layer 291 (see FIG. 10B). The thick resist mask 295 covers part of a region of the oxide semiconductor layer 291 over the gate electrode 211a, and the thin resist mask 296 covers part of the oxide semiconductor layer 291 over the gate electrode 211b. In other words, the thick resist mask 295 covers a region where the island-shaped oxide semiconductor layer 223a which will be described later, and the thin resist mask 296 covers a region where the island-shaped oxide semiconductor layer 223b which will be described later.

Then, the oxide semiconductor layer 291 is etched using the thick resist mask 295 and the thin resist mask 296. Thus, the island-shaped oxide semiconductor layer 223a is formed over the gate electrode 211a, and an island-shaped oxide semiconductor layer 221 is formed over the gate electrode 211b (see FIG. 10C.).

Figure 10D:
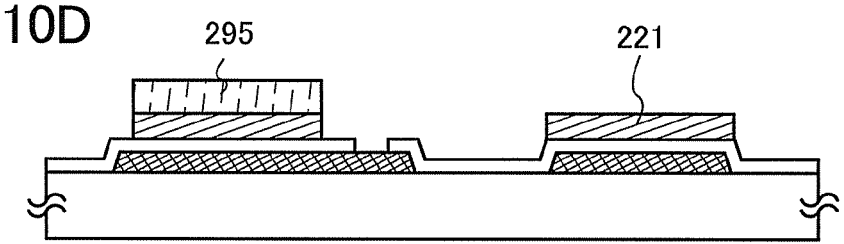
Figure 10E:
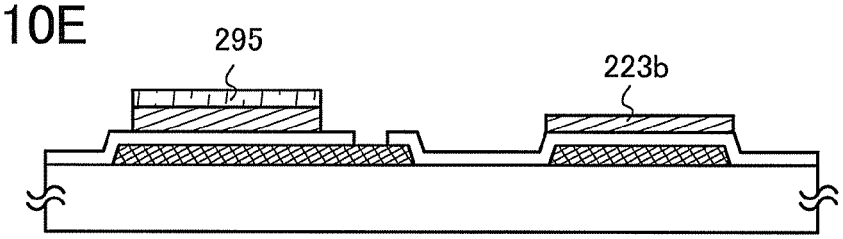
Figure 10F:
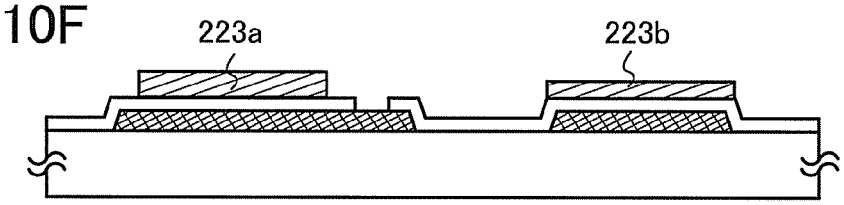

Next, the thin resist mask 296 formed over the gate electrode 211b is removed by $O_2$ ashing or the like, thereby exposing the island-shaped oxide semiconductor layer 221 (see FIG. 10D). Note that the thick resist mask 295 is also thinned by the ashing at the same time.

The exposed island-shaped oxide semiconductor layer 221 is etched carefully and thus thinned. Consequently, the thinned island-shaped oxide semiconductor layer 223b is formed (see FIG. 10E).

The resist mask 295 over the island-shaped oxide semiconductor layer 223a is removed. Thus, the thick island-shaped oxide semiconductor layer 223a is formed over the gate electrode 211a with the gate insulating layer 202 interposed therebetween, and the thin island-shaped oxide semiconductor layer 223b is formed over the gate electrode 211b with the gate insulating layer 202 interposed therebetween (see FIG. 10F). After the island-shaped oxide semiconductor layer 223a and the island-shaped oxide semiconductor layer 223b are formed, the oxide semiconductor transistor 251 and the oxide semiconductor transistor 252 are formed in the above fabrication process.

As described above, according to Embodiment 1, the oxide semiconductor transistor can be made normally on or normally off by changing the film thickness of the channel formation region without changing the layered structure of the oxide semiconductor transistor.

Figure 2A:
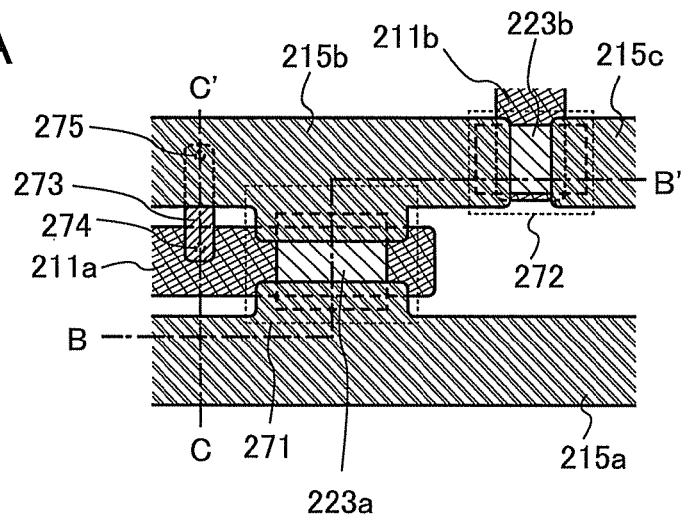
FIGS. 2A to 2C are a top view and cross-sectional views of oxide semiconductor transistors.
Figure 2B:
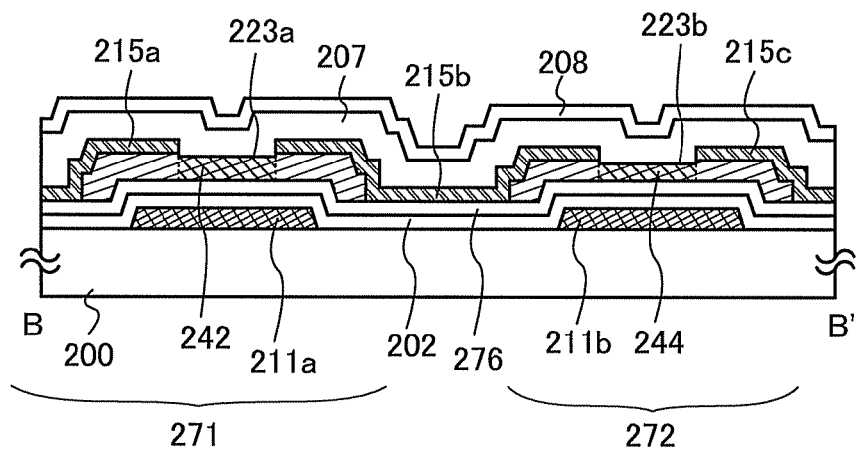
Figure 2C:
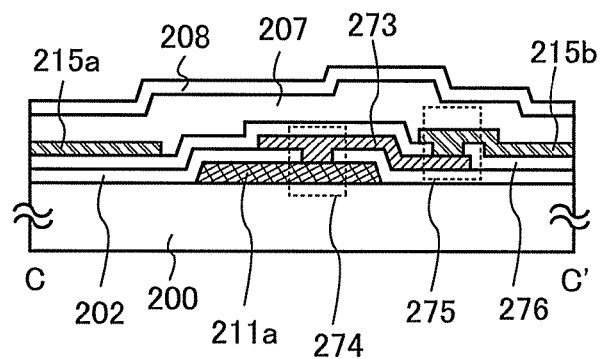

FIGS. 2A to 2C show another example of the structures of the transistor 302 and diode 309 that is different from that shown in FIGS. 1A and 1B.

FIG. 2A is a top view and FIG. 2B is a cross-sectional view taken along line B-B' shown in FIG. 2A. FIG. 2C is a cross-sectional view taken along line C-C' shown in FIG. 2A.

An oxide semiconductor transistor 272 corresponds to the transistor 302 shown in FIG. 3A. The oxide semiconductor transistor 272 includes a gate electrode 211b over a substrate 200; a gate insulating layer 202 over the gate electrode 211b; an insulating layer 276 over the gate insulating layer 202; an island-shaped oxide semiconductor layer 223b over the gate insulating layer 276; and a pair of electrodes of a wiring layer 215b and a wiring layer 215c in contact with the island-shaped oxide semiconductor layer 223b. The wiring layer 215b functions as one of a source electrode and a drain electrode of the oxide semiconductor transistor 252, and the wiring layer 215c functions as the other one of the source electrode and the drain electrode of the oxide semiconductor transistor 252. Further, an oxide insulating film 207 is formed over the island-shaped oxide semiconductor layer 223b. A protective insulating layer 208 is formed over the oxide insulating film 207.

In the oxide semiconductor transistor 272, a region which is included in the island-shaped oxide semiconductor layer 223b overlaps with the gate electrode 211b with the gate insulating layer 202 interposed therebetween, and sandwiched between the wiring layer 215b and the wiring layer 215c is a channel formation region.

In the island-shaped oxide semiconductor layer 223b, the thickness of a region 244 which does not overlap with the wiring layer 215b or the wiring layer 215c is smaller than the thickness of a region which overlaps with the wiring layer 215b or the wiring layer 215c. The thickness of the region 244 is made small by etching performed in a step of forming the wiring layer 215b and the wiring layer 215c which will be described later.

An oxide semiconductor transistor 271 corresponds to the diode 309 shown in FIG. 3A. The oxide semiconductor transistor 271 includes a gate electrode 211a over a substrate 200; a gate insulating layer 202 over the gate electrode 211a; the insulating layer 276 over the gate insulating layer 202; an island-shaped oxide semiconductor layer 223a over the insulating layer 276; and a pair of electrodes of a wiring layer 215a and a wiring layer 215b in contact with the island-shaped oxide semiconductor layer 223a. Further, an oxide insulating film 207 is formed over the island-shaped oxide semiconductor layer 223a. A protective insulating layer 208 is formed over the oxide insulating film 207.

In the oxide semiconductor transistor 271, a region which is included in the island-shaped oxide semiconductor layer 223a overlaps with the gate electrode 211a with the gate insulating layer 202 interposed therebetween, and sandwiched between the wiring layer 215a and the wiring layer 215b is a channel formation region.

In the island-shaped oxide semiconductor layer 223a, the thickness of a region 242 which does not overlap with the wiring layer 215a or the wiring layer 215b is smaller than the thickness of a region which overlaps with the wiring layer 215a or the wiring layer 215b. The thickness of the region 242 is made small by etching performed in the step of forming the wiring layer 215*a* and the wiring layer 215*b* which will be described later.

The gate electrode 211*a* of the oxide semiconductor transistor 271 is in direct contact with a wiring layer 273 through a contact hole 274 formed in the gate insulating layer 202. The wiring layer 273 is in direct contact with the wiring layer 215*b* through a contact hole 275 formed in the insulating layer 276. Consequently, the gate electrode 211*a* and the wiring layer 215*b* are electrically connected to each other through the wiring layer 273.

In other words, in the oxide semiconductor transistor 271, one of the source and the drain is electrically connected to the gate i.e., the oxide semiconductor transistor 271 is diode-connected and functions as a diode.

In FIGS. 2A to 2C, the wiring layer 273 that electrically connects the gate electrode 211*a* to the wiring layer 215*b* is formed between the gate electrode 211*a* and the wiring layer 215*b*.

Figure 8A:
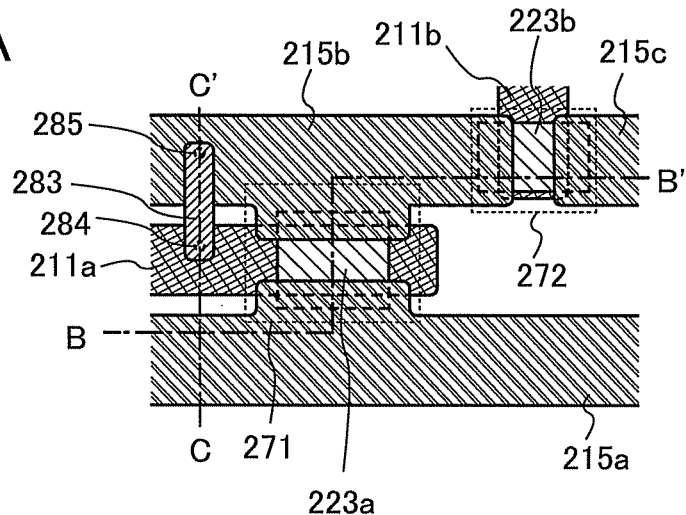
FIGS. 8A to 8C are a top view and cross-sectional views of oxide semiconductor transistors.
Figure 8B:
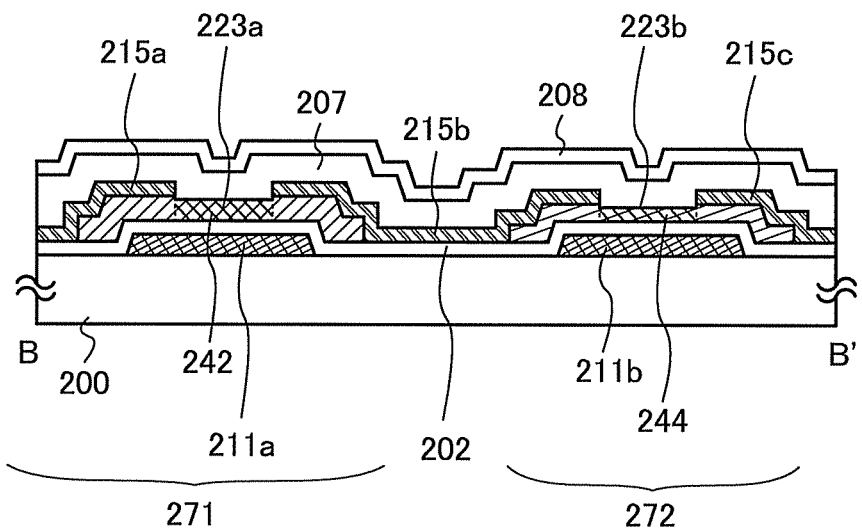
Figure 8C:
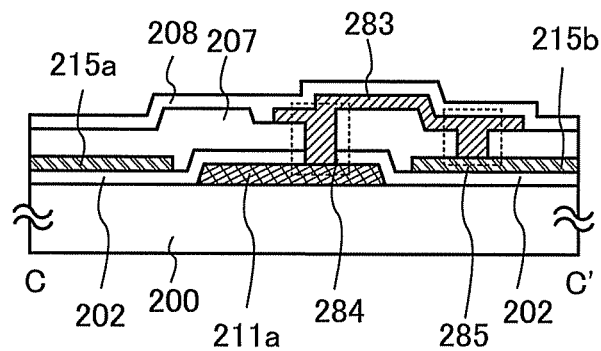

FIGS. 8A to 8C show an example of the structures of the transistor 302 and diode 309 that is different from that shown in FIGS. 2A to 2C. In FIGS. 8A to 8C, a wiring layer 283 that electrically connects the gate electrode 211*a* to the wiring layer 215*b* is formed over the gate electrode 211*a* and the wiring layer 215*b*.

FIG. 8A is a top view and FIG. 8B a cross-sectional view taken along line B-B' shown in FIG. 8A. FIG. 8C is a cross-sectional view taken along line C-C' shown in FIG. 8A.

The gate electrode 211*a* of the oxide semiconductor transistor 271 is in direct contact with the wiring layer 283 through a contact hole 284 formed in the gate insulating layer 202 and the oxide insulating film 207. The wiring layer 283 is in direct contact with the wiring layer 215*b* through a contact hole 285 formed in the oxide insulating film 207. Consequently, the gate electrode 211*a* and the wiring layer 215*b* are electrically connected to each other through the wiring layer 283.

Thus, in the oxide semiconductor transistor 271, one of the source and the drain is electrically connected to the gate i.e., the oxide semiconductor transistor 271 is diode-connected and functions as a diode.

Figure 5A:
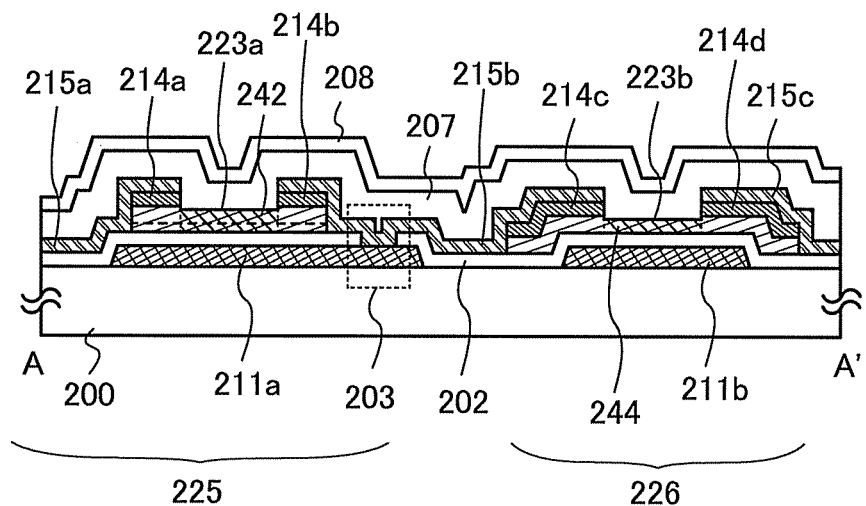
FIGS. 5A and 5B are cross-sectional views of oxide semiconductor transistors.
Figure 5B:
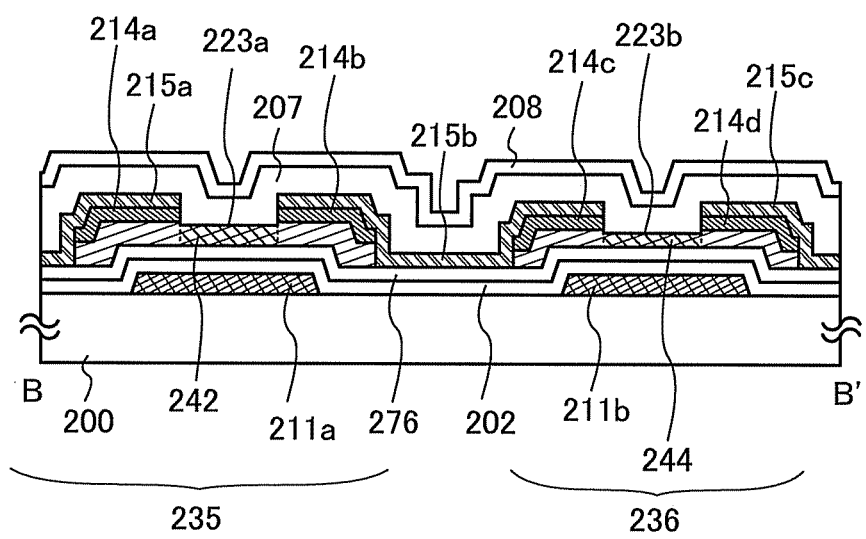

FIGS. 5A and 5B show examples of oxide semiconductor transistors the structures of which are different from those of the oxide semiconductor transistor 251 and the oxide semiconductor transistor 252 shown in FIG. 1B or those of the oxide semiconductor transistor 271 and the oxide semiconductor transistor 272 shown in FIG. 2B and FIG. 8B.

An oxide semiconductor transistor 225 shown in FIG. 5A is the same as the oxide semiconductor transistor 251 shown in FIG. 1B except that it has an oxide semiconductor layer 214*a* and an oxide semiconductor layer 214*b* over the island-shaped oxide semiconductor layer 223*a*. The oxide semiconductor layer 214*a* and the oxide semiconductor layer 214*b* function as a pair of buffer layers. In addition, the wiring layer 215*a* and the wiring layer 215*b* are formed in contact with the oxide semiconductor layer 214*a* and the oxide semiconductor layer 214*b*, respectively. In other words, the oxide semiconductor layer 214*a* is formed between the island-shaped oxide semiconductor layer 223*a* and the wiring layer 215*a*, and the oxide semiconductor layer 214*b* is formed between the island-shaped oxide semiconductor layer 223*a* and the wiring layer 215*b*.

An oxide semiconductor transistor 226 shown in FIG. 5A is the same as the oxide semiconductor transistor 252 shown in FIG. 1B except that it has an oxide semiconductor layer 214*c* and an oxide semiconductor layer 214*d* over the island-shaped oxide semiconductor layer 223*b*. The oxide semiconductor layer 214*c* and the oxide semiconductor layer 214*d* function as a pair of buffer layers. In addition, the wiring layer 215*b* and the wiring layer 215*c* are formed in contact with the oxide semiconductor layer 214*c* and the oxide semiconductor layer 214*d*, respectively. In other words, the oxide semiconductor layer 214*c* is formed between the island-shaped oxide semiconductor layer 223*b* and the wiring layer 215*b*, and the oxide semiconductor layer 214*d* is formed between the island-shaped oxide semiconductor layer 223*b* and the wiring layer 215*c*.

An oxide semiconductor transistor 235 shown in FIG. 5B is the same as the oxide semiconductor transistor 271 shown in FIG. 2B and FIG. 8B except that it has the oxide semiconductor layer 214*a* and the oxide semiconductor layer 214*b* over the island-shaped oxide semiconductor layer 223*a*. The oxide semiconductor layer 214*a* and the oxide semiconductor layer 214*b* function as a pair of buffer layers. In addition, the wiring layer 215*a* and the wiring layer 215*b* are formed in contact with the oxide semiconductor layer 214*a* and the oxide semiconductor layer 214*b*, respectively. In other words, the oxide semiconductor layer 214*a* is formed between the island-shaped oxide semiconductor layer 223*a* and the wiring layer 215*a*, and the oxide semiconductor layer 214*b* is formed between the island-shaped oxide semiconductor layer 223*a* and the wiring layer 215*b*.

An oxide semiconductor transistor 236 shown in FIG. 5B is the same as the oxide semiconductor transistor 272 shown in FIG. 2B and FIG. 8B except that it has the oxide semiconductor layer 214*c* and the oxide semiconductor layer 214*d* over the island-shaped oxide semiconductor layer 223*b*. The oxide semiconductor layer 214*c* and the oxide semiconductor layer 214*d* function as a pair of buffer layers. In addition, the wiring layer 215*b* and the wiring layer 215*c* are formed in contact with the oxide semiconductor layer 214*c* and the oxide semiconductor layer 214*d*, respectively. In other words, the oxide semiconductor layer 214*c* is formed between the island-shaped oxide semiconductor layer 223*b* and the wiring layer 215*b*, and the oxide semiconductor layer 214*d* is formed between the island-shaped oxide semiconductor layer 223*b* and the wiring layer 215*c*.

The oxide semiconductor layer 214*a*, the oxide semiconductor layer 214*b*, the oxide semiconductor layer 214*c*, and the oxide semiconductor layer 214*d* each have a higher conductivity than the island-shaped oxide semiconductor layer 223*a* and the island-shaped oxide semiconductor layer 223*b*.

Consequently, the oxide semiconductor layer 214*a* and the oxide semiconductor layer 214*b* function as a source region and a drain region of the oxide semiconductor transistor 225, and the oxide semiconductor layer 214*c* and the oxide semiconductor layer 214*d* function as a source region and a drain region of the oxide semiconductor transistor 226.

Similarly, the oxide semiconductor layer 214*a* and the oxide semiconductor layer 214*b* function as a source and a drain of the oxide semiconductor transistor 235, and the oxide semiconductor layer 214*c* and the oxide semiconductor layer 214*d* function as a source region and a drain region of the oxide semiconductor transistor 236.

An example of an oxide semiconductor layer that can be used as the oxide semiconductor layer 214*a*, the oxide semiconductor layer 214*b*, the oxide semiconductor layer 214*c*, and the oxide semiconductor layer 214*d* is the following oxide semiconductor layer.

For example, an oxide semiconductor layer using a conductive material that transmits visible light e.g., an oxide semiconductor layer that contains at least one element selected from In, Ga, Sn, Zn, Al, Mg, Hf and lanthanoid is used. A quaternary metal oxide such as an In—Sn—Ga—Zn—O-based oxide semiconductor; a ternary metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor layer, a Sn—Al—Zn—O-based oxide semiconductor, an In—Hf—Zn—O-based oxide semiconductor, an In—La—Zn—O-based oxide semiconductor, an In—Ce—Zn—O-based oxide semiconductor, an In—Pr—Zn—O-based oxide semiconductor, an In—Nd—Zn—O-based oxide semiconductor, an In—Pm—Zn—O-based oxide semiconductor, an In—Sm—Zn—O-based oxide semiconductor, an In—Eu—Zn—O-based oxide semiconductor, an In—Gd—Zn—O-based oxide semiconductor, an In—Tb—Zn—O-based oxide semiconductor, an In—Dy—Zn—O-based oxide semiconductor, an In—Ho—Zn—O-based oxide semiconductor, an In—Er—Zn—O-based oxide semiconductor, an In—Tm—Zn—O-based oxide semiconductor, an In—Yb—Zn—O-based oxide semiconductor, or an In—Lu—Zn—O-based oxide semiconductor; a binary metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; or a unary metal oxide such as an In—O-based oxide semiconductor, a Sn—O-based oxide semiconductor, or a Zn—O-based oxide semiconductor can be used, for example. Alternatively, a combination of any of the above oxide semiconductors and an element other than In, Ga, Sn, Zn, Al, Mg, Hf and lanthanoid e.g., $SiO_2$ can be used.

For example, an In—Ga—Zn—O-based oxide semiconductor means an oxide semiconductor containing indium (In), gallium (Ga), and zinc (Zn), and there is no limitation on the composition ratio thereof.

For the oxide semiconductor layer, a thin film expressed by the chemical formula $InMO_3(ZnO)_m$ (m>0) can be used. Here, M is one or more metal elements selected from Zn, Ga, Al, Mn, and Co. M can be Ga, Ga and Al, Ga and Mn, Ga and Co, or the like.

In the case where an In—Zn—O-based material is used as the oxide semiconductor, a target thereof has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, a target used for the formation of an In—Zn—O-based oxide semiconductor has an atomic ratio expressed by the equation Z>1.5X+Y where In:Zn:O=X:Y:Z.

The film thickness of the oxide semiconductor layers is selected as appropriate from values in the range of 1 nm to 300 nm. When the oxide semiconductor layers are formed using a sputtering method, the oxide semiconductor layers are formed using a target containing $SiO_2$ at 2 wt % to 10 wt %. If the oxide semiconductor layer is formed using such a target containing $SiO_2$, $SiO_x$ (X>0) that inhibits crystallization can be contained in the oxide semiconductor layer. Setting $SiO_x$ contained in the oxide semiconductor layer is preferable in that it prevents the oxide semiconductor layer from being crystallized in heat treatment performed later for dehydration or dehydrogenation.

In the case where In—Ga—Zn—O-based non-single-crystal films, for example, are used for the oxide semiconductor layers, the oxide semiconductor layers (the island-shaped oxide semiconductor layers 223a and 223b) including channel formation regions can be made different from the oxide semiconductor layers (the oxide semiconductor layers 214a, 214b, 214c, and 214d) serving as source regions and drain regions by changing the film formation conditions.

For example, in the case where the oxide semiconductor layer is formed by a sputtering method, the oxide conductive layer formed in an argon gas has n-type conductivity and activation energy (ΔE) in the range of 0.01 eV to 0.1 eV. Such an oxide semiconductor layer having n-type conductivity is preferable for a source region and a drain region when used as the oxide semiconductor layers 214a, 214b, 214c, and 214d.

Note that in Embodiment 1, the oxide semiconductor layers 214a, 214b, 214c, and 214d are In—Ga—Zn—O-based non-single-crystal films and include at least amorphous components.

Moreover, the oxide semiconductor layers 214a, 214b, 214c, and 214d may include crystal grains (nanocrystals). The crystal grain (nanocrystal) has a diameter of 1 nm to 10 nm, typically, approximately 2 nm to 4 nm.

Good electrical connection can be provided by forming each of the oxide semiconductor layers (the oxide semiconductor layers 214a, 214b, 214c, and 214d) serving as source regions and drain regions between each of the oxide semiconductor layers (the island-shaped oxide semiconductor layers 223a and 223b) including channel formation regions and each of the wiring layers (the wiring layers 215a, 215b, and 215c) serving as source electrodes and drain electrodes. Good electrical connection in a channel formation region, a source region, a drain region, a source electrode, and a drain electrode is preferable because it provides stable operation of the oxide semiconductor transistors 251, 252, 271, and 272. In addition, such oxide semiconductor transistors are preferable because they can keep excellent mobility even with a high drain voltage.

As described above, in the converter circuit of Embodiment 1, a diode-connected normally-on oxide semiconductor transistor is used as the diode which is a rectifier. A diode-connected normally-on oxide semiconductor transistor has a smaller voltage drop than a PN diode, and thus needs a low voltage applied to compensate a voltage drop. A diode-connected normally-on oxide semiconductor transistor needs a low voltage to compensate a voltage drop, and thus achieves the low power consumption of the converter circuit. A reduction in the power consumption of the converter circuit leads to a reduction in the power consumption of the photoelectric transducer device.

As described above, the oxide semiconductor transistor can be made normally on or normally off by changing the film thickness of the channel formation region without changing the layered structure of the oxide semiconductor transistor.

Figure 3B:
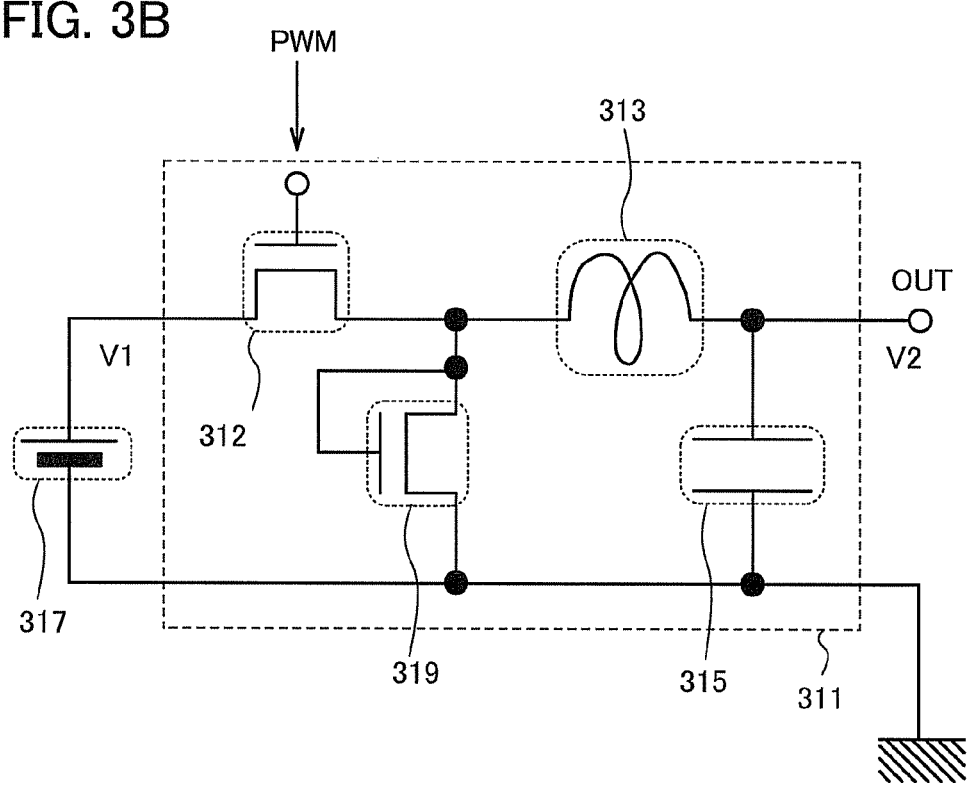

A converter circuit 311 shown in FIG. 3B is a step-down circuit including a transistor 312, a coil 313, a diode 319, and a capacitor 315.

One of a source and a drain of the transistor 312 is electrically connected to one of the electrodes of a photoelectric transducer element 317 which electrodes are on the n-type semiconductor layer side and on the p-type semiconductor layer side of the element. The other of the source and the drain of the transistor 312 is electrically connected to an output terminal of the diode 319 and one terminal of the coil 313. An input terminal of the diode 319 is electrically connected to the other of the electrodes of the photoelectric transducer element 317 which electrodes are on the n-type semiconductor layer side and on the p-type semiconductor layer side of the element, and to one terminal of the capacitor 315. The output terminal of the diode 319 is electrically connected to the other of the source and the drain of the transistor 312 and the one terminal of the coil 313. The one terminal of the coil 313 is electrically connected to the other of the source and the drain of the transistor 312 and the output terminal of the diode 319. The other terminal of the coil 313 is electrically connected to the other terminal of the capacitor 315 and the output terminal OUT. Note that the other of the electrodes of the photoelectric transducer element 317 which electrodes are on the n-type semiconductor layer side and on the p-type semiconductor layer side of the element, the input terminal of the diode 319, and the one terminal of the capacitor 315 are grounded.

The transistor 312 functions as a switching element. A gate of the transistor 312 is connected to a control circuit of the converter circuit 311. The transistor 312 is turned on and off by a signal PWM output from the control circuit of the converter circuit 311.

When the transistor 312 which is a switching element is on, excitation energy is accumulated in the coil 313 by current flowing from the input to the output of the step-down circuit.

When the transistor 312 is turned off, the coil 313 generates electromotive force to keep current, thereby turning on the diode 319. The voltage is decreased by current flowing through the diode 319 to be a voltage V2. The voltage V2 becomes lower than the voltage V1. Consequently, the converter circuit 311 functions as a step-down circuit.

Note that in Embodiment 1, an oxide semiconductor transistor is used as the transistor 312.

As described above, an oxide semiconductor transistor is a high-breakdown-voltage and large-current transistor. For this reason, such an oxide semiconductor transistor is preferably used as the transistor 312 which is a switching element in the converter circuit 311.

In Embodiment 1, the diode 319 functions as a rectifier. In Embodiment 1, a diode-connected oxide semiconductor transistor is used as the diode 319. An oxide semiconductor transistor that has a similar structure to the transistor 312 and has a gate electrode and a drain region electrically connected to each other is used as the diode-connected oxide semiconductor transistor. Thus, the transistor 312 and the diode 319 can be fabricated at the same time, which reduces the number of fabrication steps. Since the number of the fabrication steps of the converter circuit 311 can be reduced, the fabrication cost of the converter circuit 311 can be reduced.

As described above, an oxide semiconductor transistor is a high-breakdown-voltage and large-current transistor. For this reason, a diode-connected oxide semiconductor transistor is preferably used as the diode 319 in the converter circuit 311.

As described above, a normally-off oxide semiconductor transistor is used as the transistor 312 which is a switching element. A diode-connected normally-on oxide semiconductor transistor is used as the diode 319 which is a rectifier. Since the diode 319 is a diode-connected normally-on oxide semiconductor transistor, it has a smaller voltage drop than a PN diode.

As described above, according to Embodiment 1, the oxide semiconductor transistor can be made normally on or normally off by changing the film thickness of an oxide semiconductor layer including a channel formation region without changing the stacking structure of the oxide semiconductor transistor.

In Embodiment 1, a coiled wire formed over a substrate can be used as the coil 313.

In Embodiment 1, a capacitor having a first electrode, a second electrode, and a dielectric, for example, can be used as the capacitor 315.

As described above, in the converter circuit of Embodiment 1, a diode-connected normally-on oxide semiconductor transistor is used as the diode which is a rectifier. A diode-connected normally-on oxide semiconductor transistor has a smaller voltage drop than a PN diode, and thus needs a low voltage applied to compensate a voltage drop. A diode-connected normally-on oxide semiconductor transistor needs a low voltage to compensate a voltage drop, and thus achieves the low power consumption of the converter circuit. A reduction in the power consumption of the converter circuit leads to a reduction in the power consumption of the photoelectric transducer device.

Embodiment 1 allows the transistor serving as a switching element and the diode serving as a rectifier which are included in a converter circuit to be fabricated using the same materials and in the same process.

The photoelectric transducer element 307 or the photoelectric transducer element 317 of this embodiment will be described with reference to FIG. 11. In this embodiment, a solar cell using an amorphous semiconductor layer as a photoelectric transducer layer will be described as an example of the photoelectric transducer element 307.

Figure 11:
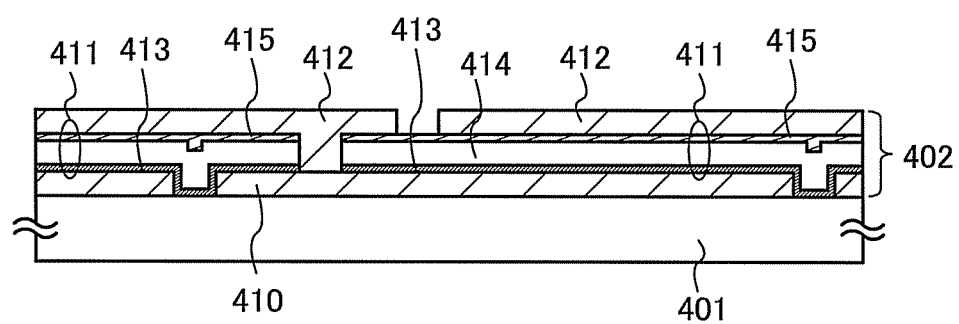
FIG. 11 is a cross-sectional view of a solar cell.

A solar cell shown in FIG. 11 includes a photoelectric transducer layer 411 which is over a substrate 401 and which is an amorphous semiconductor layer including a p-type amorphous semiconductor layer 413, an intrinsic amorphous semiconductor layer 414, and an n-type amorphous semiconductor layer 415. A conductive film 410 is formed on one surface of the photoelectric transducer layer 411. A conductive film 412 is formed on the other surface of the photoelectric transducer layer 411.

Specifically, the p-type amorphous semiconductor layer 413, the intrinsic amorphous semiconductor layer 414, and the n-type amorphous semiconductor layer 415 are layered over the conductive film 410. The conductive film 412 is formed over the n-type amorphous semiconductor layer 415.

The conductive film 410, the photoelectric transducer layer 411, and the conductive film 412 are processed into predetermined shapes. The conductive film 410, the photoelectric transducer layer 411, and the conductive film 412 processed into such predetermined shapes form a cell 402. One cell 402 is connected to another cell in series. When each cell 402 is connected to another cell 402 in series, output voltage can be increased.

The substrate 401 uses a material that transmits sunlight, on the assumption that light enters from the substrate 401 side.

For example, a glass plate of soda-lime glass, white glass, lead glass, tempered glass, ceramic glass, or the like can be used as the light-transmitting substrate 401. Alternatively, a non-alkali glass substrate of aluminosilicate glass, barium borosilicate glass, aluminoborosilicate glass, or the like; a quartz substrate; or a ceramic substrate can be used.

Although a flexible substrate of a synthetic resin such as plastics (a plastic substrate) generally tends to have a lower heat resistance than the above substrates, it can be used as the substrate 401, which transmits light, as long as it can withstand processing temperatures in fabrication steps.

Polyester, polyether sulfone (PES), polyethylene naphthalate (PEN), polycarbonate (PC), a polyamide synthetic fiber, polyether etherketone (PEEK), polysulfone (PSF), polyether imide (PEI), polyarylate (PAR), polybutylene terephthalate (PBT), polyimide, an acrylonitrile butadiene styrene resin, poly vinyl chloride, polypropylene, poly vinyl acetate, an acrylic resin, or the like can be used for the plastic substrate. An example of polyester is polyethylene terephthalate (PET).

Since light enters from the substrate 401 side, a conductive material which transmits sunlight is used for the conductive film 410.

Examples of a preferable light-transmitting conductive material include indium tin oxide (ITO), indium tin oxide containing silicon oxide (ITSO), organoindium, organotin, zinc oxide, indium zinc oxide (IZO) containing zinc oxide (ZnO), ZnO doped with gallium (Ga), tin oxide ($SnO_2$), indium oxide containing tungsten oxide, indium zinc oxide containing tungsten oxide, indium oxide containing titanium oxide, and indium tin oxide containing titanium oxide.

Note that in the case where indium tin oxide is used for the conductive film 410, if the p-type amorphous semiconductor layer 413 formed in a later step is formed over the conductive film 410, hydrogen contained in the p-type amorphous semiconductor layer 413 reduces indium tin oxide contained in the conductive film 410. Thus, the film quality of the conductive film 410 might deteriorate.

In the case where indium tin oxide is used for the conductive film 410, in order to prevent indium tin oxide from being reduced, a film in which a conductive film with a thickness of several tens of nanometers using tin oxide or using a conductive material containing a mixed material of zinc oxide and aluminum nitride is stacked between the conductive film using indium tin oxide and the p-type amorphous semiconductor layer 413 is preferably used as the conductive film 410.

When a surface of the conductive film 410 on the photoelectric transducer layer 411 side is made uneven, light is refracted or irregularly reflected at the conductive film 410. This is preferable in that optical absorptance in the photoelectric transducer layer 411 can be increased, which increases light conversion efficiency.

The photoelectric transducer layer 411 which is a stack of the p-type amorphous semiconductor layer 413 overlaid by the intrinsic amorphous semiconductor layer 414 overlaid by the n-type amorphous semiconductor layer 415 is provided over the conductive film 410.

In Embodiment 1, a p-type amorphous silicon layer is used as the p-type amorphous semiconductor layer 413. The p-type amorphous silicon layer is a silicon layer containing an element giving p-type conductivity (e.g., boron).

In Embodiment 1, an intrinsic amorphous silicon layer is used as the intrinsic amorphous semiconductor layer 414.

In Embodiment 1, an n-type amorphous silicon layer is used as the n-type amorphous semiconductor layer 415. The n-type amorphous silicon layer is a silicon layer containing an element giving n-type conductivity (e.g., phosphorus).

Note that, in Embodiment 1, although the case where the photoelectric transducer layer 411 is a stack of the p-type amorphous semiconductor layer 413 overlaid by the intrinsic amorphous semiconductor layer 414 overlaid by the n-type amorphous semiconductor layer 415 is described as an example, the photoelectric transducer layer 411 may alternatively be a stack of the n-type amorphous semiconductor layer overlaid by the intrinsic amorphous semiconductor layer overlaid by the p-type amorphous semiconductor layer.

Note that such layers are not necessarily amorphous semiconductor layers or single crystal semiconductor layers, and the p-type semiconductor layer is preferably located more on the side where light enters than the n-type semiconductor layer. The lifetime of a hole as a carrier is as short as approximately half the lifetime of an electron as a carrier. When light enters the photoelectric transducer layer having a pin junction, a large amount of electrons and holes are formed in the intrinsic semiconductor layer, the electrons move to the n-type semiconductor layer side, and the holes move to the p-type semiconductor layer side, which produces electromotive force.

When light enters from the p-type semiconductor layer side, electrons and holes are formed in the intrinsic semiconductor layer more on the p-type semiconductor layer side than on the n-type semiconductor layer side. Consequently, a distance that the holes with a short lifetime take to get to the p-type semiconductor layer can be shortened. This produces high electromotive force.

In Embodiment 1, light enters from both the p-type semiconductor layer side and the n-type semiconductor layer side. For this reason, the photoelectric transducer layer may be either a stack of the n-type semiconductor layer overlaid by the intrinsic semiconductor layer overlaid by the p-type semiconductor layer or a stack of the p-type semiconductor layer overlaid by the intrinsic semiconductor layer overlaid by the n-type semiconductor layer. Note that forming the p-type semiconductor layer on the side where light with higher intensity enters produces higher electromotive force.

As described above, the photoelectric transducer device of Embodiment 1 can reduce power consumption. In addition, the photoelectric transducer device of Embodiment 1 can reduce fabrication cost.

Embodiment 2

In Embodiment 2, an example of a circuit configuration of the converter circuit described in Embodiment 1 will be described with reference to FIG. 12.

Figure 12:
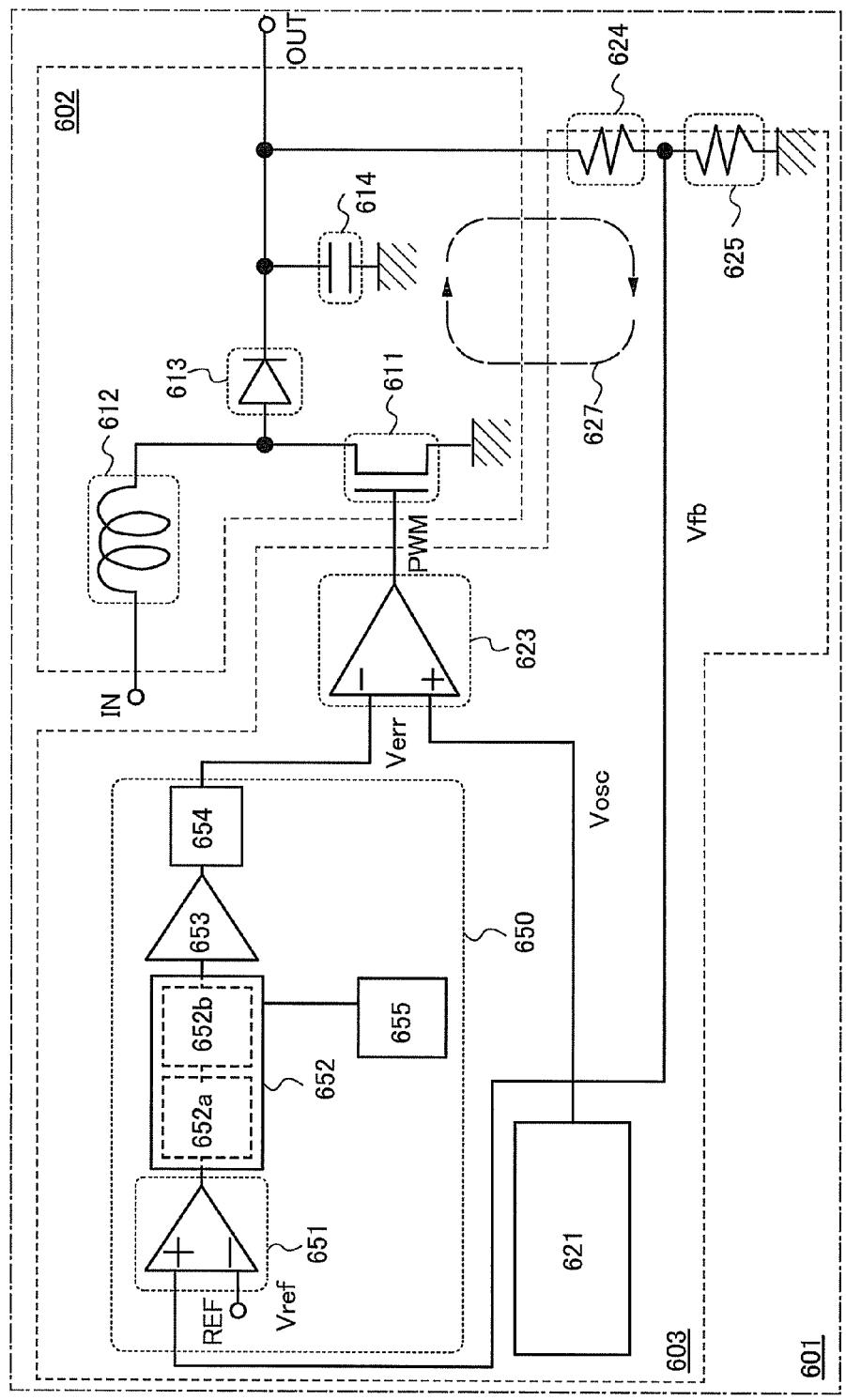
FIG. 12 is a circuit diagram of a converter circuit.

FIG. 12 shows a structure example of a power supply circuit 601. The power supply circuit 601 includes a voltage conversion circuit 602 which is a converter circuit, and a control circuit 603 of the voltage conversion circuit 602. The voltage conversion circuit 602 is the DC-DC converter of Embodiment 1.

The voltage conversion circuit 602 includes a transistor 611, a coil 612, a diode 613, and a capacitor 614. The control circuit 603 includes a triangle-wave generating circuit 621, a digital control circuit 650, a pulse width modulation output driver 623, a resistor 624, and a resistor 625. A dotted arrow 627 represents the loop of a feedback circuit. Feedback voltage Vfb that is the output voltage of the resistor 624 is input to the digital control circuit 650.

The use of the diode-connected normally-on oxide semiconductor transistor of Embodiment 1 as the diode 613 included in the voltage conversion circuit 602 is preferable in that it enables control of voltage drop.

The use of the normally-off oxide semiconductor transistor of Embodiment 1 as the transistor 611 included in the voltage conversion circuit 602 is preferable in that it allows the oxide semiconductor transistor to be made normally on or normally off by changing the film thickness of a channel formation region without changing the stacking structure of the oxide semiconductor transistor.

The digital control circuit 650 includes a comparator 651, a digital arithmetic processing circuit 652, a pulse width modulation output driver 653, and a low pass filter (LPF) 654.

In the digital control circuit 650, the digital arithmetic processing circuit 652 and the pulse width modulation output driver 653 are digital circuits. A digital circuit judges whether a signal passing through a circuit is 1 or 0 (zero) from the level of the signal with respect to the reference. Since the digital circuit judges whether the signal is 1 or 0 (zero), adequate processing is possible even when the characteristics of elements included in the digital circuit fluctuate.

The digital control circuit 650 is preferable in that it suppresses the use of a passive element that occupies a large area (e.g., a capacitor or a resistor), and thus can reduce the area of the circuit.

The comparator 651 compares reference voltage Vref input from an inversion input terminal REF with feedback voltage Vfb input from a non-inversion input terminal and outputs an H-level (high-level) digital signal or an L-level (low-level) signal, i.e., a digital signal that is 1 or 0 (zero).

The digital arithmetic processing circuit 652 includes a digital averaging integrator 652a and a digital pulse width modulator 652b. An externally provided clock divider 655 is connected to the digital arithmetic processing circuit 652, and a clock signal from the clock divider 655 is input to the digital arithmetic processing circuit 652.

The digital arithmetic processing circuit 652 performs averaging treatment, integration treatment, and digital pulse width modulation treatment on a digital signal output from the comparator 651. In the digital arithmetic processing circuit 652, the digital averaging integrator 652a performs averaging treatment and integration treatment, and the digital pulse width modulator 652b performs digital pulse width modulation treatment.

The digital arithmetic processing circuit 652 first holds N-bit digital signals (including a high level (H) signal and a low level (L) signal) output from the comparator 651, then compares the number of H signals with that of L signals, and then outputs an H signal when the number of H signals is larger than that of L signals, and an L signal in the contrary case. Thus, the digital signal is averaged.

In accordance with the averaged digital signal, integration is performed by addition of "−1" when the level of the signal is H, and integration is performed by addition of "+1" when the level of the signal is L. Thus, the averaged digital signal is integrated.

The position of a phase in pulse width modulation is set in accordance with the integrated digital signal. Thus, digital pulse width modulation treatment is performed. A pulse width modulation output signal on which the digital pulse width modulation treatment is performed is input to the pulse width modulation output driver 653.

The triangle-wave generation circuit 621 generates a triangle wave Vosc which is necessary for a pulse width modulation generation signal.

An output signal Verr of the digital control circuit 650 is input to the inversion input terminal of the pulse width modulation output driver 623, and the triangle wave Vosc generated by the triangle-wave generation circuit 621 is input to the non-inversion input terminal.

The pulse width modulation output driver 623 compares the output signal Verr of the digital control circuit 650 and the triangle wave Vosc with each other and outputs an H-level (high-level) signal to the transistor 611 as the pulse width modulation signal PWM when the signal level of the triangle wave Vosc is higher than that of the output signal Verr of the digital control circuit 650. In contrast, when the signal level of the triangle wave Vosc is lower than that of the output signal Verr of the digital control circuit 650, the pulse width modulation output driver 623 outputs an L-level (low-level) signal to the transistor 611 as the pulse width modulation signal PWM.

As described above, the photoelectric transducer device of Embodiment 2 can reduce power consumption. In addition, the photoelectric transducer device of Embodiment 2 can reduce fabrication cost.

Embodiment 3

In Embodiment 3, a photovoltaic module is obtained by using the photoelectric transducer device of Embodiment 1 or 2. The case where the obtained photovoltaic module is mounted on an electric propulsion motor car will be described as an example.

Examples of the photovoltaic module of Embodiment 3 will be described with reference to FIG. 13, FIGS. 14A and 14B, and FIGS. 15A and 15B. The photovoltaic module of Embodiment 3 is fabricated using the photoelectric transducer device of Embodiment 1 or 2.

Figure 13:
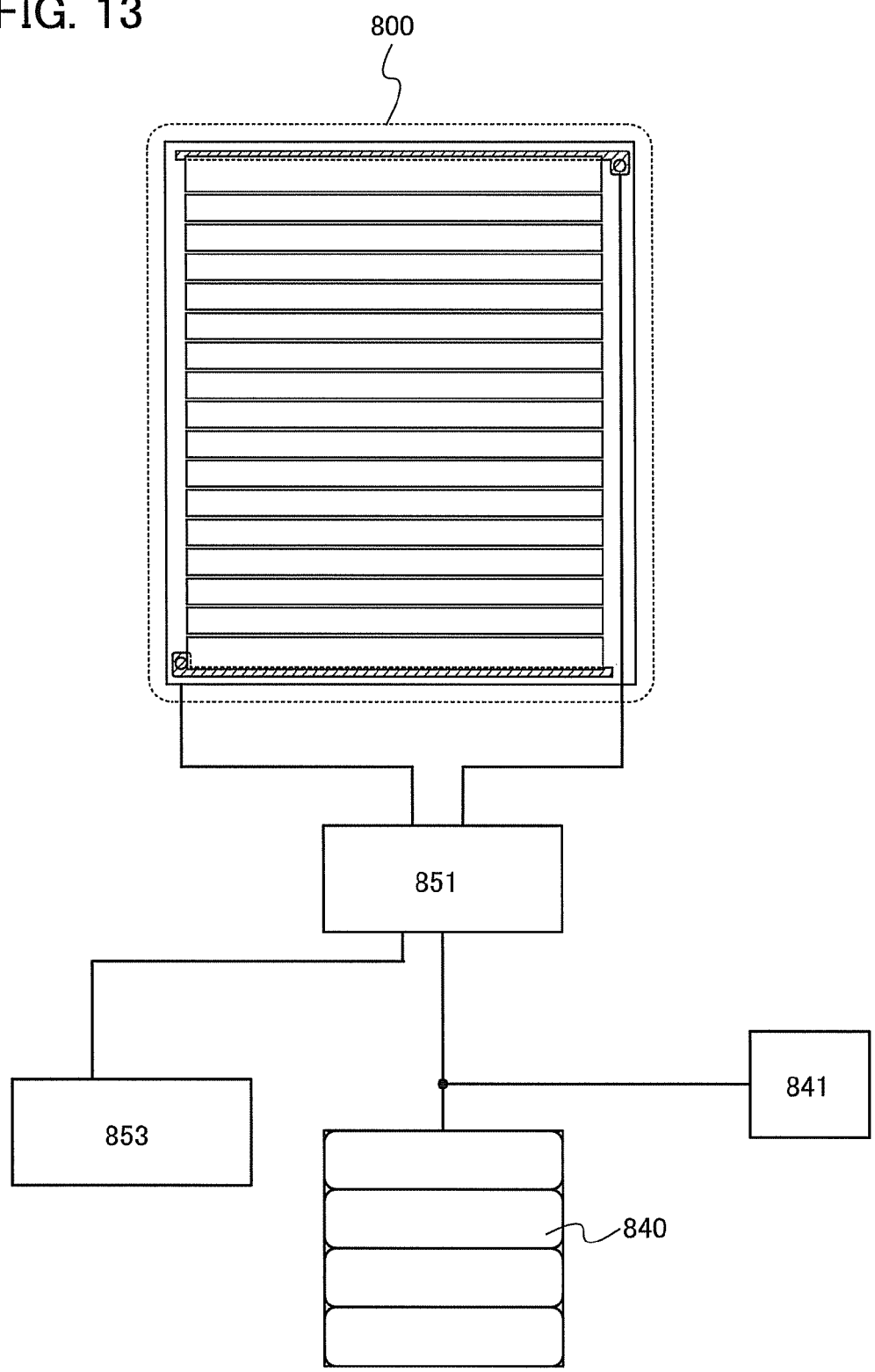
FIG. 13 is a top view of a photovoltaic module.

FIG. 13 shows an example of a photovoltaic system using a photovoltaic module 800.

A voltage conversion circuit 851 including a DC-DC converter and the like is connected to the photovoltaic module 800. The output voltage of the photovoltaic module 800 is raised or lowered by the voltage conversion circuit 851.

A control circuit 853 is connected to the voltage conversion circuit 851. The control circuit 853 performs maximum power point tracking (MITT) on the voltage conversion circuit 851 so as to obtain the maximum power of the photovoltaic module 800.

In addition, the control circuit 853 controls output voltage from the voltage conversion circuit 851 and stores electricity in a storage battery 840. Further, in the case where electricity is sufficiently stored in the storage battery 840, the control circuit 853 controls electric power supplied from the photovoltaic module 800 so that the electric power is directly output to an external circuit 841.

The photovoltaic module 800 is fabricated using the photoelectric transducer device of Embodiment 1 or 2. In Embodiment 3, the solar cell using an amorphous semiconductor layer as the photoelectric transducer layer 411 described in Embodiment 1 is used as an example of the photovoltaic module 800. Note that the photovoltaic module 800 is not necessarily the solar cell, and may be the different solar cell described in Embodiment 1.

When an electric double layer capacitor is used as the storage battery 840, the storage battery 840 does not need chemical reaction in charging; thus, electricity can be stored in the storage battery 840 rapidly. Further, lifetime can be increased about eight times and charging and discharging efficiency can be increased about 1.5 times compared with those of a lead storage battery or the like which uses chemical reaction. The photovoltaic system described in Embodiment 3 can be used in a variety of external circuits 841 which use electric power, such as lighting or electronic devices.

Figure 14A:
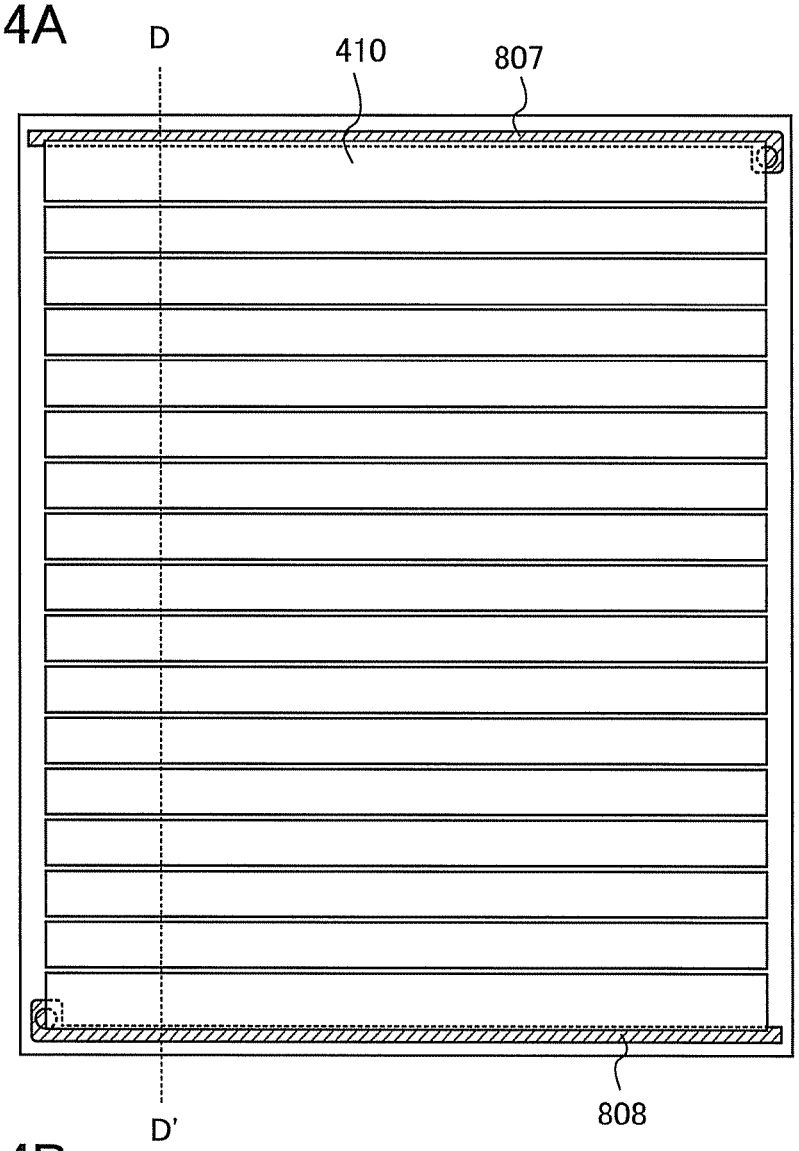
FIGS. 14A and 14B are diagrams showing an example of a photovoltaic system using the photovoltaic module.
Figure 14B:
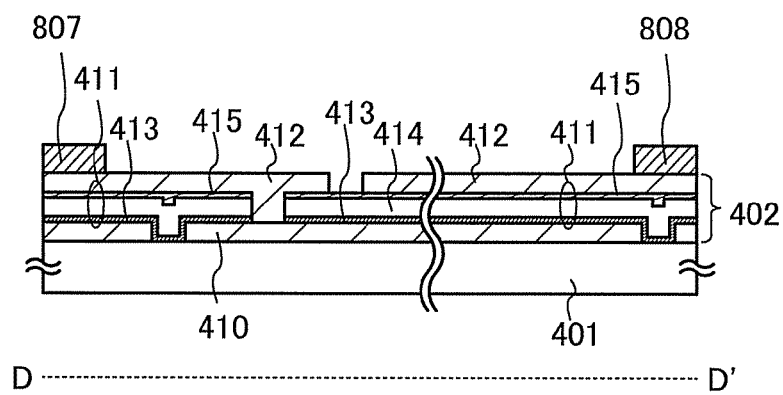

FIGS. 14A and 14B show a structure example of the photovoltaic module 800.

The photovoltaic module 800 is the solar cell using an amorphous semiconductor layer as the photoelectric transducer layer 411 described in Embodiment 1. Note that components in FIGS. 14A and 14B use the same reference numerals as the components in FIG. 11. FIG. 14B is a cross-sectional view taken along line D-D' in FIG. 14A.

An auxiliary electrode 807 and an auxiliary electrode 808 are formed in contact with the conductive film 412 provided over the photoelectric transducer layer 411. Each of the auxiliary electrode 807 and the auxiliary electrode 808 is electrically connected to the conductive film 412 in a cell at the farthest end.

Figure 15A:
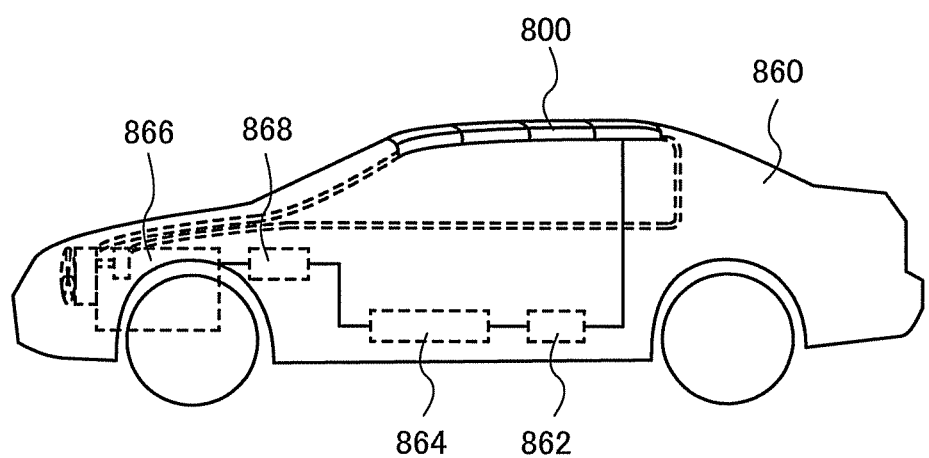
FIGS. 15A and 15B are diagrams showing an electric propulsion motor car including the photovoltaic module.
Figure 15B:
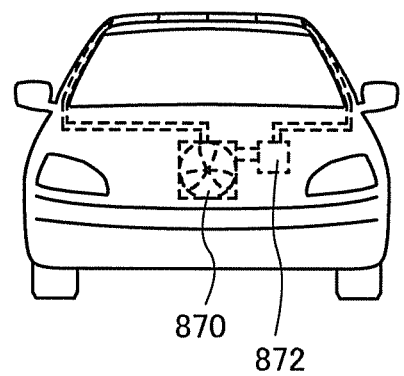

FIGS. 15A and 15B show an example of an electric propulsion motor car 860 in which the photovoltaic module 800 shown in FIG. 13 is mounted on its roof portion. The photovoltaic module 800 is connected to a battery or a capacitor 864 through a converter 862. In other words, electricity is stored in the battery or the capacitor 864 with the use of electric power supplied from the photovoltaic module 800. Charging and discharging may be selected in accordance with the operation condition of an engine 866 which is monitored by a monitor 868.

The photoelectric conversion efficiency of the photovoltaic module 800 tends to be decreased by heat. In order to suppress such a decrease in photoelectric conversion efficiency, liquid for cooling or the like may be circulated in the photovoltaic module 800. For example, cooling water in a radiator 870 may be circulated by a circulation pump 872. Needless to say, this embodiment is not limited to the structure in which the liquid for cooling is shared by the photovoltaic module 800 and the radiator 870. In the case where the decrease in photoelectric conversion efficiency is not serious, the liquid does not need to be circulated.

The photoelectric transducer device of Embodiment 3 is preferable in that it reduces a voltage drop, needs a low voltage to compensate a voltage drop, reduces the power consumption of a converter circuit, and reduces the power consumption of a photoelectric transducer device.

Further, the photoelectric transducer device of Embodiment 3 is preferable in that it reduces the fabrication cost of the converter circuit and the fabrication cost of the photoelectric transducer device.

This application is based on Japanese Patent Application serial no. 2010-129033 filed with Japan Patent Office on Jun. 4, 2010, the entire contents of which are hereby incorporated by reference.

What is claimed is:

1. A photoelectric transducer device comprising:
   a photoelectric transducer element comprising electrodes; and
   a converter circuit comprising:
      a coil comprising:
         a first terminal; and
         a second terminal;
      a first transistor comprising:
         a first terminal;
         a second terminal; and
         an oxide semiconductor layer including a channel formation region, the oxide semiconductor layer of the first transistor including indium and oxide;
      a second transistor comprising:
         a gate electrode;
         a first terminal;
         a second terminal; and
         an oxide semiconductor layer including a channel formation region, the oxide semiconductor layer of the second transistor including indium and oxide; and
      a capacitor comprising electrodes;
   wherein one of the electrodes of the photoelectric transducer element is electrically connected to the first terminal of the coil,
   wherein the second terminal of the coil is electrically connected to the first terminal of the first transistor, the gate electrode, and the first terminal of the second transistor,
   wherein the second terminal of the first transistor is electrically connected to the other of the electrodes of the photoelectric transducer element, and one of the electrodes of the capacitor, and
   wherein the second terminal of the second transistor is electrically connected to the other of the electrodes of the capacitor.

2. The photoelectric transducer device according to claim 1, wherein the converter circuit is a DC-DC converter.

3. A photoelectric transducer device comprising:
   a photoelectric transducer element comprising electrodes; and
   a converter circuit comprising:
      a coil comprising:
         a first terminal; and
         a second terminal;
      a first transistor comprising:
         a first terminal;
         a second terminal; and
         an oxide semiconductor layer including a channel formation region, the oxide semiconductor layer of the first transistor including indium and oxide;
      a second transistor comprising:
         a gate electrode;
         a first terminal;
         a second terminal; and
         an oxide semiconductor layer including a channel formation region, the oxide semiconductor layer of the second transistor including indium and oxide; and
      a capacitor comprising electrodes;
   wherein one of the electrodes of the photoelectric transducer element is electrically connected to the first terminal of the coil,
   wherein the second terminal of the coil is electrically connected to the first terminal of the first transistor, the gate electrode, and the first terminal of the second transistor,
   wherein the second terminal of the first transistor is electrically connected to the other of the electrodes of the photoelectric transducer element, and one of the electrodes of the capacitor,
   wherein the second terminal of the second transistor is electrically connected to the other of the electrodes of the capacitor, and
   wherein a film thickness of the channel formation region of the first transistor is different from a film thickness of the channel formation region of the second transistor.

4. The photoelectric transducer device according to claim 3, wherein the converter circuit is a DC-DC converter.

5. A photoelectric transducer device comprising:
   a photoelectric transducer element; and
   a converter circuit comprising:
      a first transistor comprising:
         a first terminal;
         a second terminal; and
         an oxide semiconductor layer including a channel formation region, the oxide semiconductor layer of the first transistor including indium and oxide;

a second transistor comprising:
  a gate electrode;
  a first terminal;
  a second terminal; and
  an oxide semiconductor layer including a channel formation region, the oxide semiconductor layer of the second transistor including indium and oxide;
a coil comprising:
  a first terminal; and
  a second terminal; and
a capacitor comprising electrodes;
wherein one of the electrodes of the photoelectric transducer element is electrically connected to the first terminal of the first transistor;
wherein the second terminal of the first transistor is electrically connected to the gate electrode, the first terminal of the second transistor, and the first terminal of the coil,
wherein the second terminal of the second transistor is electrically connected to the other of the electrodes of the photoelectric transducer element, and one of the electrodes of the capacitor, and
wherein the second terminal of the coil is electrically connected to the other of the electrodes of the capacitor.

6. The photoelectric transducer device according to claim 5, wherein the converter circuit is a DC-DC converter.

7. A photoelectric transducer device comprising:
a photoelectric transducer element; and
a converter circuit comprising:
  a first transistor comprising:
    a first terminal;
    a second terminal; and
    an oxide semiconductor layer including a channel formation region, the oxide semiconductor layer of the first transistor including indium and oxide;
  a second transistor comprising:
    a gate electrode;
    a first terminal;
    a second terminal; and
    an oxide semiconductor layer including a channel formation region, the oxide semiconductor layer of the second transistor including indium and oxide;
  a coil comprising:
    a first terminal; and
    a second terminal; and
  a capacitor comprising electrodes;
wherein one of the electrodes of the photoelectric transducer element is electrically connected to the first terminal of the first transistor;
wherein the second terminal of the first transistor is electrically connected to the gate electrode, the first terminal of the second transistor, and the first terminal of the coil,
wherein the second terminal of the second transistor is electrically connected to the other of the electrodes of the photoelectric transducer element, and one of the electrodes of the capacitor,
wherein the second terminal of the coil is electrically connected to the other of the electrodes of the capacitor, and
wherein a film thickness of the channel formation region of the first transistor is different from a film thickness of the channel formation region of the second transistor.

8. The photoelectric transducer device according to claim 7, wherein the converter circuit is a DC-DC converter.

9. The photoelectric transducer device according to claim 1, wherein the coil is a coiled wire formed over a substrate over which the photoelectric transducer element and the converter circuit are formed.

10. The photoelectric transducer device according to claim 1, wherein the first transistor is normally off and the second transistor is normally on.

11. The photoelectric transducer device according to claim 3, wherein the coil is a coiled wire formed over a substrate over which the photoelectric transducer element and the converter circuit are formed.

12. The photoelectric transducer device according to claim 3, wherein the film thickness of the channel formation region of the first transistor is smaller than the film thickness of the channel formation region of the second transistor.

13. The photoelectric transducer device according to claim 3, wherein the first transistor is normally off and the second transistor is normally on.

14. The photoelectric transducer device according to claim 5, wherein the coil is a coiled wire formed over a substrate over which the photoelectric transducer element and the converter circuit are formed.

15. The photoelectric transducer device according to claim 5, wherein the first transistor is normally off and the second transistor is normally on.

16. The photoelectric transducer device according to claim 7, wherein the coil is a coiled wire formed over a substrate over which the photoelectric transducer element and the converter circuit are formed.

17. The photoelectric transducer device according to claim 7, wherein the film thickness of the channel formation region of the first transistor is smaller than the film thickness of the channel formation region of the second transistor.

18. The photoelectric transducer device according to claim 7, wherein the first transistor is normally off and the second transistor is normally on.

19. A semiconductor device comprising:
an input terminal; and
a converter circuit comprising:
  a coil comprising:
    a first terminal; and
    a second terminal;
  a first transistor comprising:
    a first terminal;
    a second terminal; and
    an oxide semiconductor layer including a channel formation region, the oxide semiconductor layer of the first transistor including indium and oxide;
  a second transistor comprising:
    a gate electrode;
    a first terminal;
    a second terminal; and
    an oxide semiconductor layer including a channel formation region, the oxide semiconductor layer of the second transistor including indium and oxide; and
  a capacitor comprising electrodes;
wherein the input terminal is electrically connected to the first terminal of the coil,
wherein the second terminal of the coil is electrically connected to the first terminal of the first transistor, the gate electrode, and the first terminal of the second transistor, wherein the second terminal of the first transistor is electrically connected to one of the electrodes of the capacitor, wherein the second terminal of the second transistor is electrically connected to the other of the electrodes of the capacitor, and wherein the coil is a coiled wire formed over a substrate over which the converter circuit is formed.

20. The semiconductor device according to claim 19, wherein the converter circuit is a DC-DC converter.

21. The semiconductor device according to claim 19, wherein the first transistor is normally off and the second transistor is normally on.

22. A semiconductor device comprising:
an input terminal; and
a converter circuit comprising:
a first transistor comprising:
a first terminal;
a second terminal; and
an oxide semiconductor layer including a channel formation region, the oxide semiconductor layer of the first transistor including indium and oxide;
a second transistor comprising:
a gate electrode;
a first terminal;
a second terminal; and
an oxide semiconductor layer including a channel formation region, the oxide semiconductor layer of the second transistor including indium and oxide;
a coil comprising:
a first terminal; and
a second terminal; and
a capacitor comprising electrodes;
wherein the input terminal is electrically connected to the first terminal of the first transistor;
wherein the second terminal of the first transistor is electrically connected to the gate electrode, the first terminal of the second transistor, and the first terminal of the coil, wherein the second terminal of the second transistor is electrically connected to one of the electrodes of the capacitor, wherein the second terminal of the coil is electrically connected to the other of the electrodes of the capacitor, and wherein the coil is a coiled wire formed over a substrate over which the converter circuit is formed.

23. The semiconductor device according to claim 22, wherein the converter circuit is a DC-DC converter.

24. The semiconductor device according to claim 22, wherein the first transistor is normally off and the second transistor is normally on.

25. The photoelectric transducer device according to claim 1, wherein each of the oxide semiconductor layer of the first transistor and the oxide semiconductor layer of the second transistor further include gallium and zinc.

26. The photoelectric transducer r device according to claim 3, wherein each of the oxide semiconductor layer of the first transistor and the oxide semiconductor layer of the second transistor further include gallium and zinc.

27. The photoelectric transducer device according to claim 5, wherein each of the oxide semiconductor layer of the first transistor and the oxide semiconductor layer of the second transistor further include gallium and zinc.

28. The photoelectric transducer device according to claim 7, wherein each of the oxide semiconductor layer of the first transistor and the oxide semiconductor layer of the second transistor further include gallium and zinc.

29. The semiconductor device according to claim 19, wherein each of the oxide semiconductor layer of the first transistor and the oxide semiconductor layer of the second transistor further include gallium and zinc.

30. The semiconductor device according to claim 22, wherein each of the oxide semiconductor layer of the first transistor and the oxide semiconductor layer of the second transistor further include gallium and zinc.

* * * * *